US007923733B2

(12) United States Patent
Kamata

(10) Patent No.: US 7,923,733 B2
(45) Date of Patent: Apr. 12, 2011

(54) SEMICONDUCTOR DEVICE

(75) Inventor: Koichiro Kamata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 34 days.

(21) Appl. No.: 12/351,881

(22) Filed: Jan. 12, 2009

(65) Prior Publication Data
US 2009/0200557 A1  Aug. 13, 2009

(30) Foreign Application Priority Data

Feb. 7, 2008  (JP) ................................. 2008-027140

(51) Int. Cl.
*H01L 29/04* (2006.01)
(52) U.S. Cl. ................ 257/72; 257/E27.1; 257/E27.125
(58) Field of Classification Search ............... 257/59, 257/71, 72, 291, 296, E27.1, E27.125
See application file for complete search history.

(56) References Cited

U.S. PATENT DOCUMENTS

| 6,512,271 B1 * | 1/2003 | Yamazaki et al. ............ 257/350 |
| 6,531,713 B1 | 3/2003 | Yamazaki |
| 7,588,970 B2 | 9/2009 | Ohnuma et al. |
| 2008/0062112 A1 | 3/2008 | Umezaki |

FOREIGN PATENT DOCUMENTS

| JP | 2002-152080 | 5/2002 |
| WO | WO 2006/137573 | 12/2006 |

* cited by examiner

*Primary Examiner* — Quoc D Hoang
(74) *Attorney, Agent, or Firm* — Eric J. Robinson; Robinson Intellectual Property Law Office, P.C.

(57) ABSTRACT

A semiconductor device includes a semiconductor layer including a channel region, and a first region and a second region to which an impurity element is introduced to make the first region and the second region a source and a drain, a third region, and a gate electrode provided to partly overlap with the semiconductor layer with a gate insulating film interposed therebetween In the semiconductor layer, the first region is electrically connected to the gate electrode through a first electrode to which an AC signal is input, the second region is electrically connected to a capacitor element through a second electrode, the third region overlaps with the gate electrode and contains an impurity element at lower concentrations than each of the first region and the second region.

30 Claims, 21 Drawing Sheets

SEMICONDUCTOR DEVICE

BACKGROUND OF THE INVENTION

1. Field of the Invention

This invention relates to a semiconductor device. This invention particularly relates to a semiconductor device capable of wireless data communication, a so-called IC chip (also referred to as an ID chip or a transponder) for RFID (radio frequency identification).

Note that the semiconductor device herein means all devices that can function by utilizing the semiconductor characteristics.

2. Description of the Related Art

In recent years, an environment in which it is possible to access an information network anytime and anywhere, as it is called ubiquitous information society, has been put into place. In such environment, an individual identification technique in which an ID (individual identification number) is given to an individual object to clarify records of the object so that it is useful for production, management, and the like has been researched for practical use. In particular, semiconductor devices (hereinafter referred to as semiconductor devices and also referred to as ID chips, IC chips, and transponders) which utilize an RFID (radio frequency identification) technique and performs wireless data communication with external communication devices (hereinafter referred to as communication devices, and also referred to as reader/writers, controllers, and interrogators) have become widely used.

A semiconductor device receives a wireless signal, which is transmitted from a communication device, with an antenna. Being an AC voltage signal (hereinafter referred to as an AC signal), the wireless signal is converted into a DC voltage signal (hereinafter referred to as a DC signal) by a rectifier circuit for rectification. The DC signal is input to a constant voltage circuit (also referred to as a regulator or a power supply circuit) so that power supply voltage Vdd is generated. The power supply voltage Vdd generated in the constant voltage circuit is supplied to a plurality of circuits included in the semiconductor device.

As a rectifier element in a semiconductor device, which forms a rectifier circuit for supplying a DC signal to a constant voltage circuit, a rectifier element formed using a transistor a gate of which is in electrical connection with one of source and drain terminals, a so-called diode-connected transistor, can be given for cost reduction. Patent Document 1 (Japanese Published Patent Application No. 2002-152080) discloses a structure with a transistor which is diode-connected and provided in a rectifier circuit in a semiconductor device.

SUMMARY OF THE INVENTION

A diode-connected transistor in a rectifier circuit deteriorates over time due to an electrical stress or the like. Deterioration of a transistor included in a rectifier circuit is caused by a stress due to high voltage generated from a radio signal with high frequency, which is transmitted and received between a semiconductor device and a communication device.

Here, one object is to suppress the deterioration in the rectifier circuit by reducing the stress to the diode-connected transistor, which is caused by an AC signal.

According to one illustrative aspect of this invention, a semiconductor device is provided with a transistor including one region (hereinafter referred to as a first region) to which an impurity element is introduced to make the first region a source or a drain, which is electrically connected to a gate; the other region (hereinafter referred to as a second region) to which an impurity element is introduced to make the second region a source or a drain; and a third region which contains an impurity element at lower concentrations than each of the first region and the second region. The third region is provided not on the first region side but in a region which overlaps with a gate electrode on the second region side.

According to one illustrative aspect of this invention, a semiconductor device includes a semiconductor layer provided with a first region and a second region to which an impurity element is introduced to make the first region and the second region a source and a drain, a third region, and a channel region, and a gate electrode provided to partly overlap with the semiconductor layer with a gate insulating film interposed between the gate electrode and the semiconductor layer. In the semiconductor layer, the first region is electrically connected to the gate electrode through a first electrode to which an AC signal is input, the second region is electrically connected to a capacitor element through a second electrode, the channel region overlaps with the gate electrode and is provided between the first region and the third region so as to be in contact with the first region, and the third region overlaps with the gate electrode, and is a region containing the impurity element at lower concentrations than each of the first region and the second region.

In the semiconductor device according to this invention, a stress due to a wireless signal with high frequency, which is applied on a diode-connected transistor, can be suppressed, so that deterioration in a rectifier circuit can be decreased.

BRIEF DESCRIPTION OF THE DRAWINGS

In the accompanying drawings;

FIGS. 17A to 17C are diagrams for describing Embodiment Mode 4,

DETAILED DESCRIPTION OF THE INVENTION

Figure 1A:
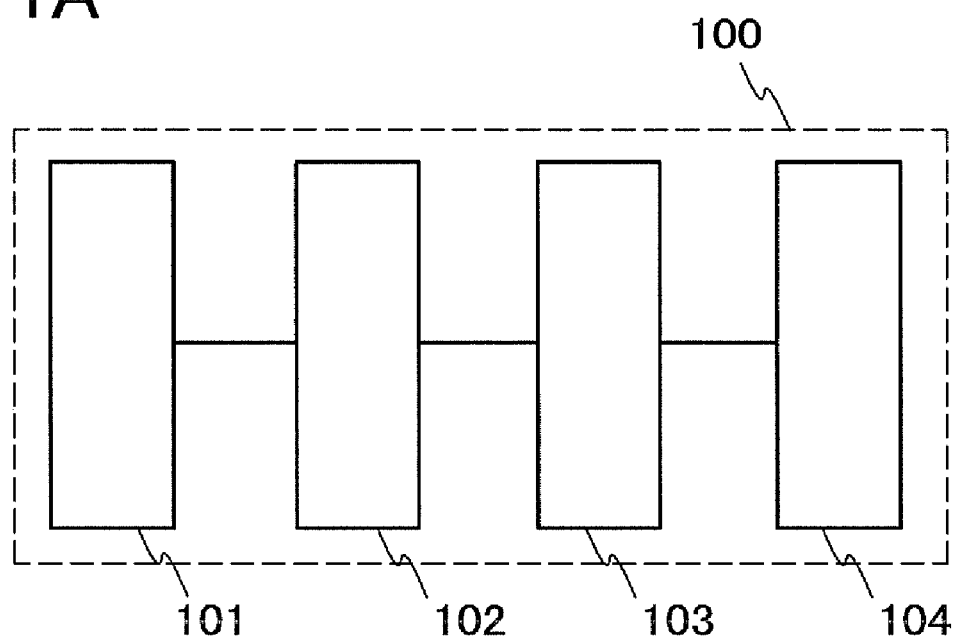
FIGS. 1A and 1B are diagrams for describing Embodiment Mode 1.

Embodiment modes and embodiments of this invention will be specifically described with reference to the drawings. However, it is easily understood by a person skilled in the art that the mode and the detail of this invention can be variously changed without departing from the spirit and the scope of this invention. Therefore, this invention should not be construed as being limited to the description in the following embodiment modes and embodiments.

Embodiment Mode 1

A structure of a semiconductor device will be described. Note that a semiconductor device in this embodiment mode is used as an element of a so-called IC chip for RFID which is capable of wireless data communication with a communication device by utilizing semiconductor characteristics.

First, a block diagram and a circuit diagram of a semiconductor device will be described. In a semiconductor device shown in FIGS. 1A and 1B, a semiconductor device 100 includes an antenna 101, a rectifier circuit 102, a constant voltage circuit 103, and a logic circuit 104. The semiconductor device 100 receives a wireless signal at the antenna, and the antenna 101 outputs an AC signal. The AC signal output from the antenna 101 is converted to a signal with direct current (hereinafter also referred to as a DC signal) by the rectifier circuit 102. In accordance with the DC signal output from the rectifier circuit 102, the constant voltage circuit 103 generates power supply voltage Vdd, so that the logic circuit 104 can operate.

Note that the antenna 101 in FIG. 1A receives a wireless signal of a radio wave from an external communication device (not shown), and transmits a signal to the communication device.

Note that in FIG. 1A, there is no particular limitation on the shape of the antenna 101. That is, a transmission method of a signal which is applied to the antenna 101 in the semiconductor device 100 may be selected in consideration of use application as appropriate, and an antenna with optimal length and shape in accordance with the transmission method can be provided.

For example, in the case where an electromagnetic induction method (e.g., a 13.56 MHz band) is employed as a transmission method, a conductive film which functions as an antenna is formed into a ring shape (e.g., a loop antenna) or a spiral shape (e.g., a spiral antenna) because electromagnetic induction due to a change in flux density is utilized.

Alternatively, in the case where a micro wave method (e.g., a UHF band (a band of 860 to 960 MHz) or 2.45 GHz band) is employed as a transmission method, the length and the shape of the conductive film which functions as the antenna may be set as appropriate in consideration of the wavelength of a radio wave used for transmitting a signal, and the conductive film which functions as the antenna can be formed into a linear shape (e.g., a dipole antenna), a flat shape (e.g., a patch antenna), or the like. In addition, the shape of the conductive film which functions as the antenna is not limited to the linear shape, and may have a curved line shape, a serpentine shape, or a combination thereof in consideration of the wavelength of an electromagnetic wave.

Figure 1B:
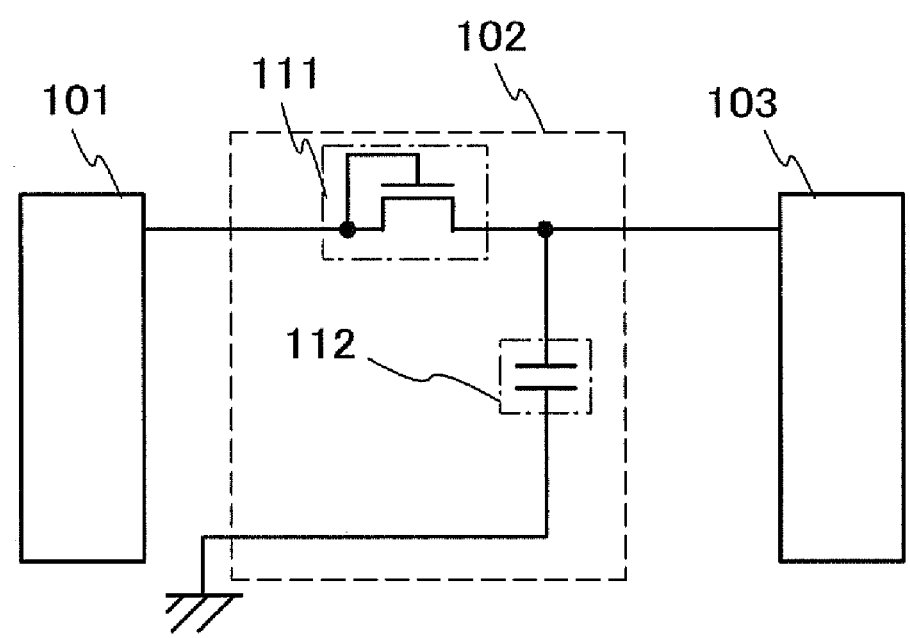

Next, an example of a specific circuit configuration of the rectifier circuit 102 in the semiconductor device will be described. As the example of the rectifier circuit 102 in the semiconductor device, a half-wave rectifier circuit shown in FIG. 1B will be described. The rectifier circuit 102 shown in FIG. 1B includes a transistor 111 and a capacitor element 112. Since the transistor 111 in the rectifier circuit 102 shown in FIG. 1B is used as a diode, a region that is to be a drain of the transistor 111 is electrically connected to a gate of the transistor 111 (hereinafter such connection is also referred to as diode-connection). Note that the rectifier circuit 102 shown in FIG. 1B may be provided with a clamp circuit on an input side of the rectifier circuit 102. By employing a structure with the clamp circuit, a voltage level of a DC signal output can be higher.

Note that like the transistor 111 shown as an example in FIG. 1B, a transistor is an element including at least three terminals of a gate, a drain, and a source. The transistor includes a channel region between drain and source regions, and current can flow through the drain region, the channel region, and the source region. Here, since a source and a drain are switched to each other depending on the structure, operating condition, or the like of a transistor, it is difficult to identify which is the source or the drain. In specific, in the semiconductor device described in this embodiment mode, regions which functions as the source and the drain are switched to each other over time in accordance with a signal with alternating current (hereinafter referred to as an AC signal) generated by a wireless signal with high frequency.

Here, in this embodiment mode, for example, the regions serving as the source and the drain are denoted as a first region and a second region. A region serving as a gate is denoted as a gate electrode. Moreover, in this embodiment mode, one of the regions serving as the source and drain, which is electrically connected to the gate is denoted as the first region, and the other of the regions serving as the source and drain is denoted as the second region.

Therefore, in this embodiment mode, a transistor which is diode-connected means a transistor in which a first region and a gate of the transistor are electrically connected to each other. In addition, the first region and a second region are regions which do not overlap with a gate electrode. Moreover, a channel region is provided between the first region and a third region so as to overlap with the gate electrode, and is in contact with the first region. Note that the third region is provided between the channel region and the second region so as to overlap with the gate electrode.

Note that terms such as first, second, third to Nth (N is a natural number) seen in this specification are used in order to avoid confusion between components and do not set a limitation on number.

Note that in this specification, the meaning of "A and B are connected to each other" includes electrical connection between A and B. Note that the case where A and B are electrically connected includes the case where an object with any electrical action is interposed between A and B.

Further, the transistor described in this embodiment mode is an n-channel transistor. By using the n-channel transistor as the transistor, an effect which suppress deterioration of the transistor can be remarkably obtained, which is preferable.

Figure 2A:
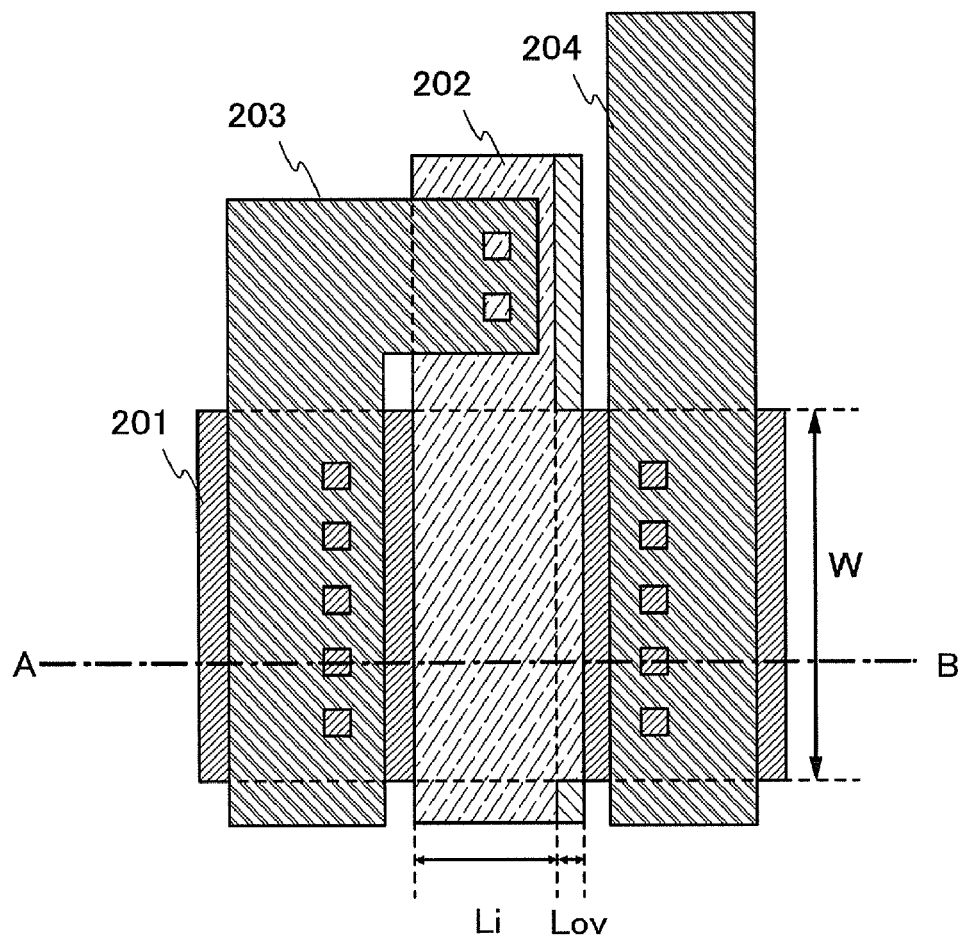
FIGS. 2A and 2B are diagrams for describing Embodiment Mode 1.
Figure 2B:
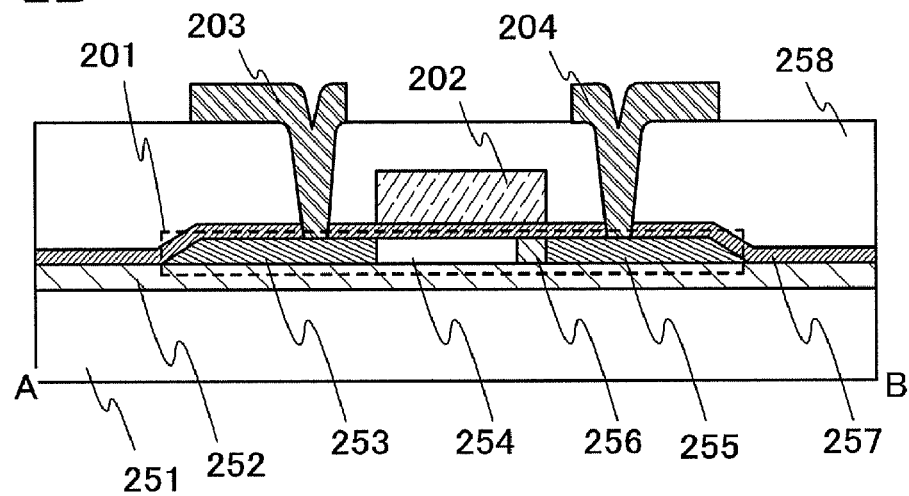

Next, a top view and a cross-sectional view of the transistor included in the rectifier circuit 102 shown in FIG. 1B are shown with reference to FIGS. 2A and 2B.

One example of the top view of the transistor included in the rectifier circuit is shown in FIG. 2A. The top view shown in FIG. 2A shows a semiconductor layer 201 provided with a first region, a second region, a third region, and a channel region, a gate electrode 202 provided over the semiconductor layer 201 with a gate insulating film interposed therebetween, a first electrode 203 electrically connected to the first region of the semiconductor layer 201 and the gate electrode 202, and a second electrode 204 electrically connected to the second region of the semiconductor layer 201.

Next, the cross-sectional view of the transistor along dashed-dotted line A-B shown in FIG. 2A, which shows the top view of the transistor, is shown in FIG. 2B. The transistor shown in FIG. 2B includes an insulating film 252 provided over a substrate 251, the semiconductor layer 201 provided with a first region 253, a channel region 254, a second region 255, and a third region 256, a gate insulating film 257 provided so as to cover the semiconductor layer 201, the gate electrode 202 provided over the channel region 254 and the third region 256 with the gate insulating film 257 interposed therebetween, an interlayer insulating film 258 provided over the gate insulating film 257 and the gate electrode 202, the first electrode 203 which is provided so as to fill an opening portion of a hole provided in the interlayer insulating film 258, and is electrically connected to the first region 253, and the second electrode 204 which is provided so as to fill an opening portion of a hole provided in the interlayer insulating film 258, and is electrically connected to the second region 255.

Note that in the top view shown in FIG. 2A and the cross-sectional view shown in FIG. 2B, length in a channel length direction of the semiconductor layer 201, that is, the length of the channel region 254 in a direction from the first electrode 203 to the second electrode 204 is channel length Li, and the length of the third region 256 is Lov. In addition, the length of the channel region in a direction perpendicular to the channel length direction of the semiconductor layer is channel width W.

As the substrate 251, a glass substrate, a quartz substrate, an SOI substrate, a metal substrate, a stainless steel substrate, or the like can be used. Since there is no strict limitation on the area or shape of such substrates, for example, a rectangular substrate having a side of 1 meter or longer can be used as the substrate 251, whereby the productivity can be drastically improved. This is a major advantage as compared to the case of using a circular silicon substrate.

Note that by providing a separation layer over a substrate and separating elements such as transistors, the elements such as the transistors can be transferred to a substrate or the like having flexibility or interposed between sealing layers formed of organic resin or the like. Note that transferring means to transfer elements formed over a substrate to another substrate. Note that interposing means to sandwich formed elements between sealing layers.

The insulating film 252 functions as a base layer. The insulating film 252 is formed using an inorganic compound with a single-layer or a stacked layer by a sputtering method, a plasma CVD method, a coating method, a printing method, or the like. As typical examples of the inorganic compound, silicon oxide (SiOx), silicon nitride (SiNx), silicon oxynitride (SiOxNy) (x>y), and silicon nitride oxide (SiNxOy) (x<y) can be given. Note that the insulating film 252 which functions as the base layer may have a layered structure. In the case where the insulating film 252 which functions as the base layer employs a two-layer structure, a silicon nitride oxide film may be formed as a first insulating film, and a silicon oxynitride film may be formed as a second insulating film, for example. In the case where the insulating film 252 which functions as the base layer employs a three-layer structure, a silicon oxide film may be formed as a first insulating film, a silicon nitride oxide film may be formed as a second insulating film, and a silicon oxynitride film may be formed as a third insulating film. Alternatively, a silicon oxynitride film may be formed as a first insulating film, a silicon nitride oxide film may be formed as a second insulating film, and a silicon oxynitride film may be formed as a third insulating film. The base film functions as a blocking film for preventing the entry of impurities from the substrate 251.

Note that a silicon oxynitride means a substance that contains more oxygen than nitrogen and, in the case where measurements are performed using Rutherford backscattering spectrometry (RBS) and hydrogen forward scattering (HFS), includes oxygen, nitrogen, Si, and hydrogen at concentrations ranging from 50 to 70 at. %, 0.5 to 15 at. %, 25 to 35 at. %, and 0.1 to 10 at. %, respectively. Further, silicon nitride oxide means a substance that contains more nitrogen than oxygen and, in the case where measurements are performed using RBS and HFS, includes oxygen, nitrogen, Si, and hydrogen at concentrations ranging from 5 to 30 at. %, 20 to 55 at. %, 25 to 35 at. %, and 10 to 25 at. %, respectively. Note that percentages of nitrogen, oxygen, Si, and hydrogen fall within the ranges given above, where the total number of atoms contained in the silicon oxynitride film or the silicon nitride oxide film is defined as 100 at. %.

The semiconductor layer 201 may be formed in the following manner: an amorphous semiconductor film is formed; crystallization is performed on the amorphous semiconductor film to make it a crystalline semiconductor film; a resist mask is formed by a photolithography method; and the crystalline semiconductor film is selectively etched.

The amorphous semiconductor film is formed by a sputtering method, an LPCVD method, a plasma CVD method, or the like. Then, the amorphous semiconductor film is crystallized by being irradiated with laser light. Alternatively, the amorphous semiconductor film may be crystallized by a method in which laser light irradiation is combined with a thermal crystallization method using an RTA or an annealing furnace, or with a thermal crystallization method using a metal element for promoting crystallization.

The first region 253, the channel region 254, the second region 255, and the third region 256 formed in the semiconductor layer 201 are formed by introducing an impurity element to the semiconductor layer 201 with a resist mask formed by a photolithography method and the gate electrode 202 which is formed later as masks. The first region 253 and the second region 255 function as regions to be a source and a drain in a transistor.

Note that as an impurity element to be introduced, an n-type impurity element is used. As an n-type impurity element, phosphorus (P), arsenic (As), or the like can be used.

Note that the third region is a region in which the concentration of an impurity is lower than that in the first region and the second region.

The gate insulating film 257 is formed by using a single layer or a stacked layer of a film containing oxide of silicon and/or nitride of silicon by a CVD method, a sputtering method, or the like. For example, the gate insulating film 257 is formed using a single layer of a film containing silicon oxide, a film containing silicon oxynitride, or a film containing silicon nitride oxide, or a stacked layer of combination thereof.

The gate electrode is formed in the following manner: a conductive film is formed; a resist mask is formed over the conductive film by a photolithography method; and the conductive film is selectively etched. The conductive film is formed using an element selected from tantalum (Ta), tungsten (W), titanium (Ti), molybdenum (Mo), aluminum (Al), copper (Cu), chromium (Cr), niobium (Nb), and the like, an alloy material or a compound material containing any of the above elements as its main component, or an alloy material or a compound material containing any of the above elements and a silicon (Si) element by a plasma CVD method, a sputtering method or the like. Alternatively, the gate electrode may be formed using a semiconductor material (for example, silicon (Si)) typified by polycrystalline silicon doped with an impurity element such as phosphorus. Alternatively, the gate electrode may be formed by stacking two different conductive films.

The interlayer insulating film 258 can be formed to have a single-layer or a stacked layer of an insulating film containing oxygen or nitrogen, such as silicon oxide, silicon nitride, silicon oxynitride, or silicon nitride oxide; a film containing carbon such as DLC (diamond-like carbon); an organic material such as epoxy, polyimide, polyamide, polyvinyl phenol, benzocyclobutene, or acrylic; or a siloxane material such as a siloxane resin.

The first electrode 203 and the second electrode 204 are each formed to have a single layer or a stacked layer formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), an alloy material or a compound material containing any of the above elements as its main component. An alloy material containing aluminum as a main component corresponds to, for example, a material which contains aluminum as a main component and also contains nickel, or a material which contains aluminum as a main component and also contains nickel and one or both of carbon and silicon. As each of the first electrode 203 and the second electrode 204, a layered structure of a barrier film, an aluminum silicon (Al—Si) film, and a barrier film, or a layered structure of a barrier film, an aluminum silicon (Al—Si) film, a titanium nitride film, and a barrier film may be used, for example. Note that the barrier film corresponds to a thin film made of titanium, a nitride of titanium, molybdenum, or a nitride of molybdenum. Aluminum or aluminum silicon is suitable as a material for forming either the first electrode 203 or the second electrode 204 because aluminum and aluminum silicon have low resistance values and are inexpensive. If barrier layers are provided as the top and bottom layers, hillock generation of aluminum or aluminum silicon can be prevented. In addition, if the barrier film is formed of titanium that has high reducing ability, a thin native oxide film which may possibly be formed over the crystalline semiconductor films can be reduced and thus a favorable contact can be obtained between the barrier film and the crystalline semiconductor films.

In this manner, the transistor in the rectifier circuit 102 in the semiconductor device can be manufactured.

Next, an effect of a transistor with the structure described in FIGS. 2A and 2B will be described in detail with reference to drawings.

Figure 3A:
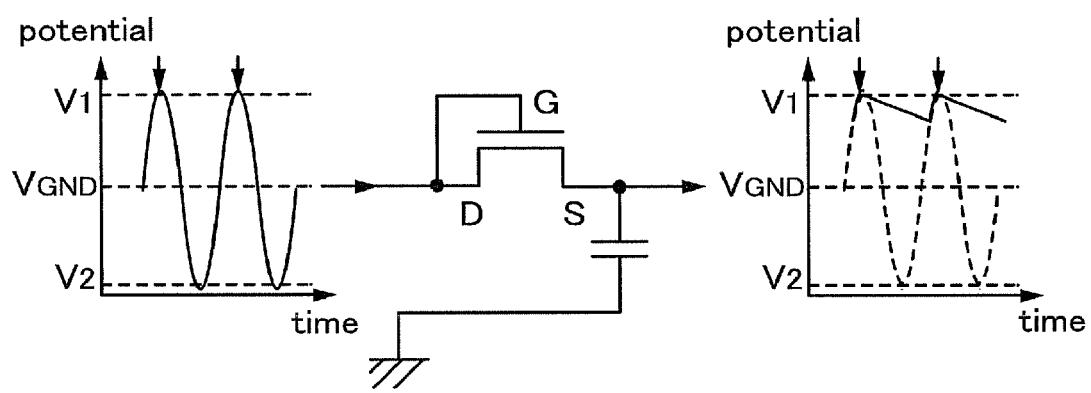
FIGS. 3A and 3B are diagrams for describing Embodiment Mode 1.
Figure 3B:
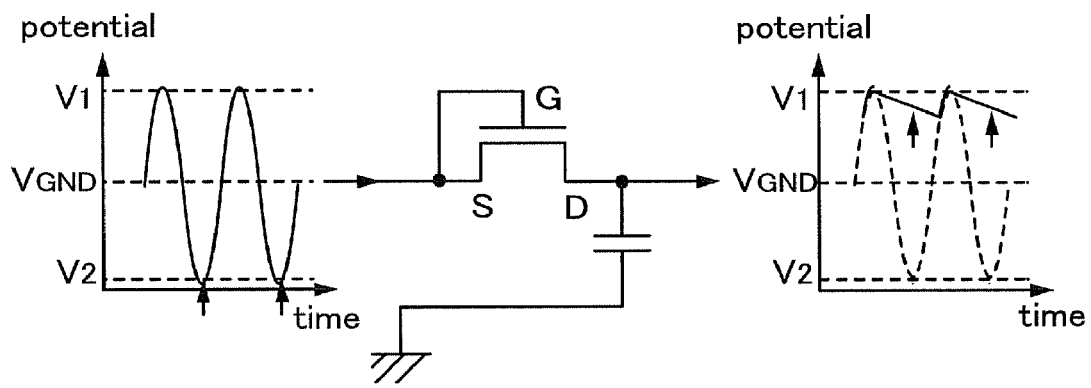

FIGS. 3A and 3B are diagrams schematically illustrating an AC signal input to the diode-connected transistor in the rectifier circuit 102 and a DC signal output from the rectifier circuit 102. As the AC signal, a signal whose first potential ($V_1$) and second potential ($V_2$) consecutively change with a reference potential ($V_{GND}$) as an intermediate potential between $V_1$ and $V_2$ is input from a side where the gate of the transistor is electrically connected to the first region. Here, the first potential is set to be higher than the reference potential, and the reference potential is set to be higher than the second potential. Note that the first potential and the second potential may be plural depending on a signal received at an antenna in some cases.

In FIGS. 3A and 3B, a voltage amplitude level of the AC signal whose first potential ($V_1$) and second potential ($V_2$) consecutively change with the reference potential ($V_{GND}$) as the intermediate potential between $V_1$ and $V_2$ changes periodically. Therefore, the source and the drain of the transistor are switched to each other periodically in FIGS. 3A and 3B. Of impurity regions of an n-channel transistor, one on a side with higher potential is a drain, and the other on a side with lower potential is a source.

Accordingly, in a state of timing when the first potential of the AC signal is input, as shown in FIG. 3A, a terminal on the first region side electrically connected to the gate is a drain, and a terminal on the second region side electrically connected to the capacitor element is a source. During a period (hereinafter also referred to as a first period) in which the potential of the terminal on the first region side which is to be the drain is higher than the reference potential and equal to or lower than the first potential, the potential of the terminal on the second region side is higher than the reference potential and equal to or lower than the first potential (see arrows in FIG. 3A). Then, the potential of the terminal on the second region side is held by the capacitor element electrically connected to the second region.

On the other hand, in a state of timing when the second potential of the AC signal is input, as shown in FIG. 3B, the terminal on the first region side electrically connected to the gate is a source, and the terminal on the second region side electrically connected to the capacitor element is a drain. At that time, the potential of the terminal on the second region side which is to be the drain is higher than the reference potential and is kept at a value equal to or lower than the first potential during the first period. Accordingly, during a period (hereinafter also referred to as a second period) in which the potential of the terminal on the first region side is equal to or higher than the second potential and equal to or lower than the reference potential, the potential of the terminal on the second region side is higher than the reference potential as in the first period, and equal to or lower than the first potential (see arrows in FIG. 3B).

From the description in FIGS. 3A and 3B, in the case where the AC signal is input to the diode-connected transistor in the rectifier circuit 102, the source and the drain are found out to be switched to each other between the first period and the second period. Therefore, in the case where a so-called gate-overlapped LDD structure (hereinafter referred to as a GOLD structure) in which a gate and a low-concentration impurity region (hereinafter referred to as an LDD (lightly doped drain) region) provided in a drain region overlap with each other is employed as a structure of the drain region in the transistor, in order to take a countermeasure against the case where deterioration due to hot carriers occurs in the transistor, it is proposed that low-concentration impurity regions are need to be provided for both a source side and a drain side in a region which overlaps with the gate of the transistor. However, in the case where the regions in which the gate and the low-concentration impurity region overlap with each other are provided for both the source side and the drain side, parasitic capacitance (also referred to as gate overlap capacitance) is generated electrically in parallel with the transistor. This is because the region which overlaps with the gate is increased by providing LDD regions for both the regions to be the source and the drain. An increase in parasitic capacitance may cause leakage of an AC signal input to the rectifier circuit.

Figure 4A:
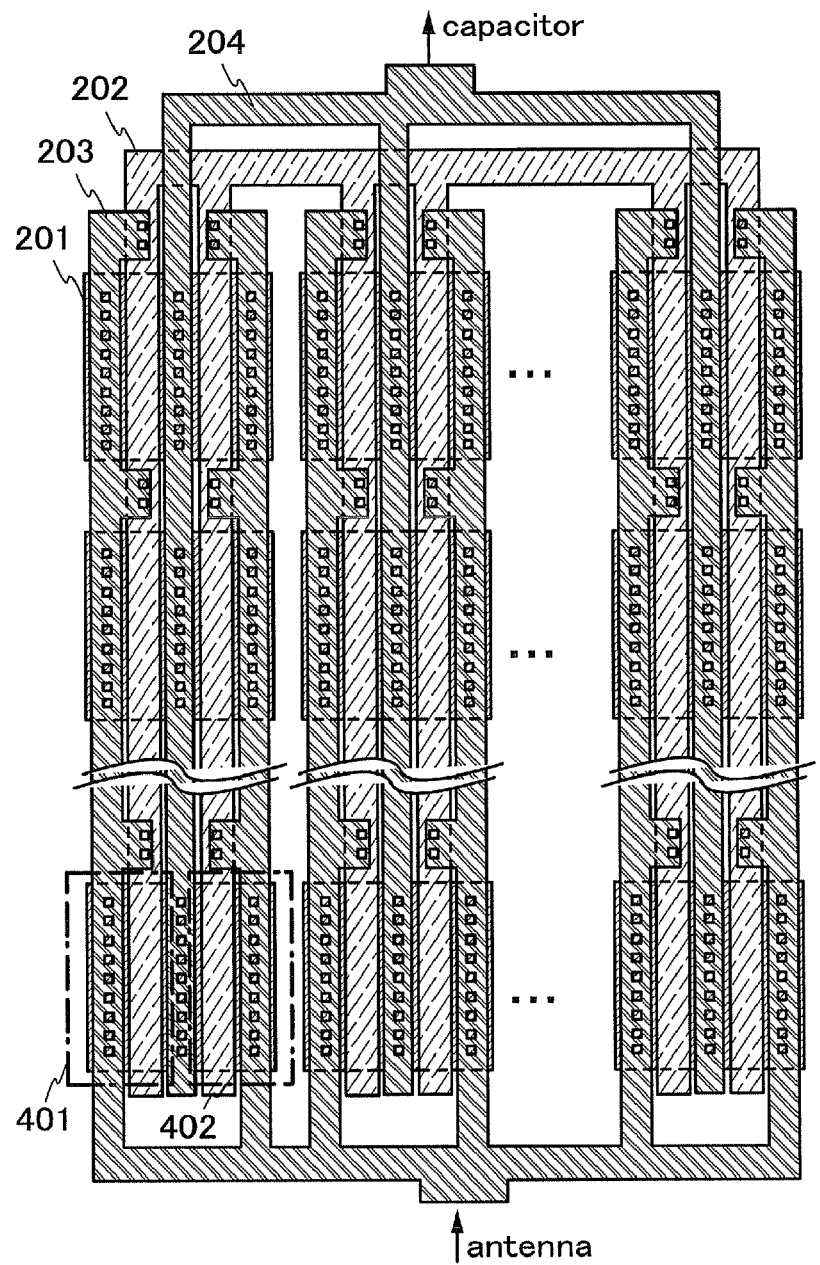
FIGS. 4A and 4B are diagrams for describing Embodiment Mode 1.
Figure 4B:
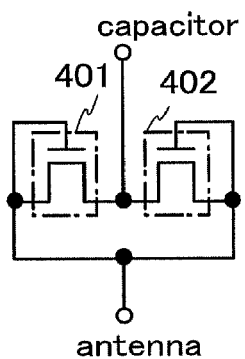

Next, a top view of a diode-connected transistor in a rectifier circuit will be described in FIG. 4A. In the top view shown in FIG. 4A, the semiconductor layer 201, the gate electrode 202, the first electrode 203, and the second electrode 204 are shown, which are described in FIG. 2A, and transistors 401 and 402 shown in FIG. 4A are transistors electrically connected to each other in parallel. In addition, in FIG. 4A, the first electrode 203 is electrically connected to the antenna, and the second electrode is electrically connected to one electrode of the capacitor element. Further, FIG. 4B is a circuit diagram related to connection of the transistors 401 and 402. The rectifier circuit including diode-connected transistors can be designed to have a small channel length Li and a large channel width W of each transistor, which is described in FIG. 2A, by electrical connection between the transistor 401 and the transistor 402 in parallel.

Figure 5:
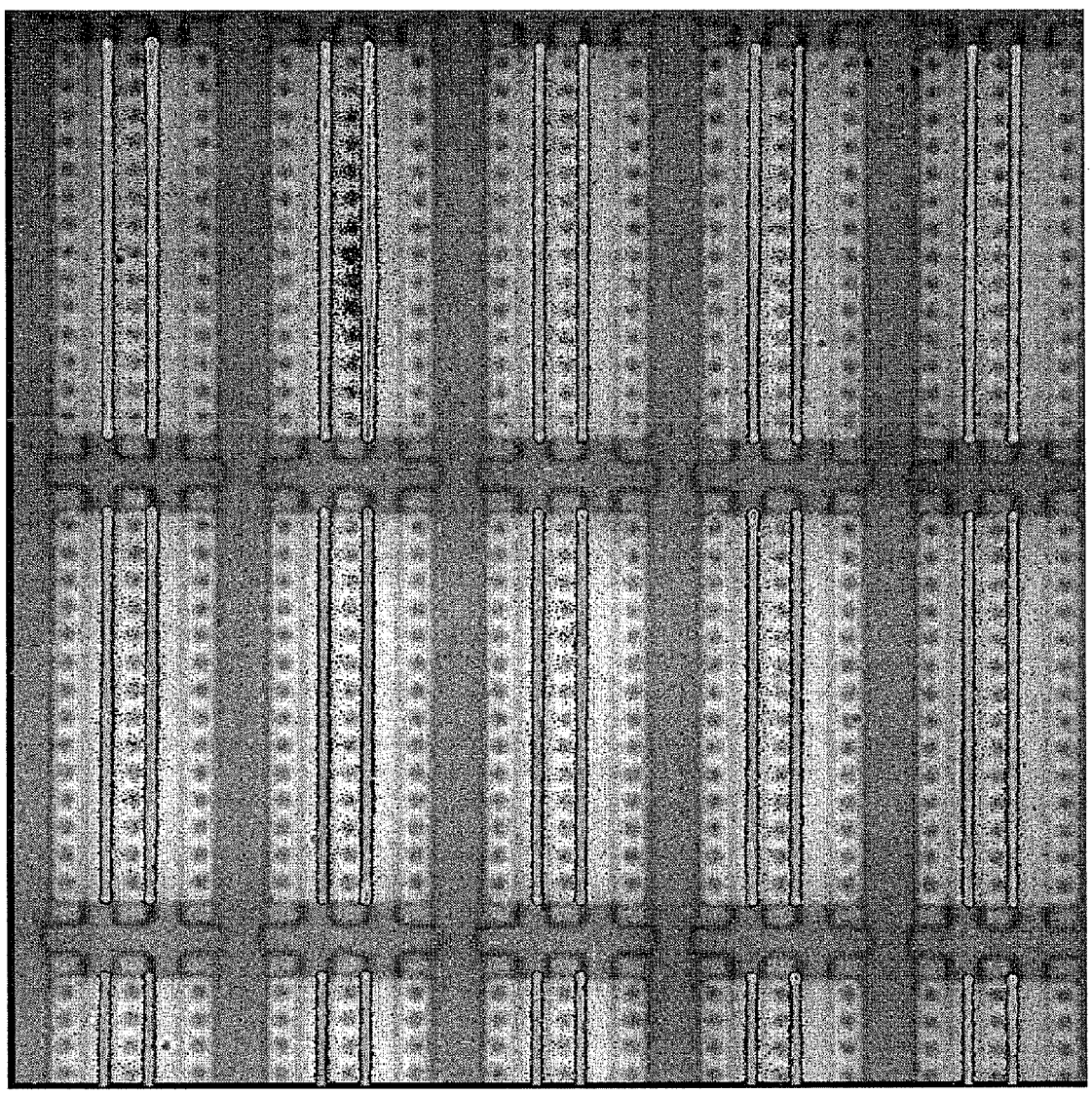
FIG. 5 is a diagram for describing Embodiment Mode 1.

A rectifier circuit portion in the semiconductor device, which is the same part as the top view in FIG. 4A, is observed by an emission microscope during a period when a wireless signal of 13.56 MHz is received at an antenna, and the image observed is shown in FIG. 5. As the emission microscope for observing an image of the transistor in the rectifier circuit portion, an emission microscope PHEMOS1000 (trade name) manufactured by Hamamatsu Photonics K.K. is used, and the observed image is photographed at 100-fold magnification and exposed for 120 seconds. In any diode-connected transistors in the rectifier circuit as shown in FIG. 5, light emission due to generation of hot electrons is observed not in the terminal on the first region side which is connected to the gate of the diode-connected transistor, but in the terminal on the second region side.

According to the observation with the emission microscope, the fact is discovered that hot electrons due to an AC signal, which causes deterioration in characteristics of a diode-connected transistor, is observed not in the first region side electrically connected to the gate but only in the second region side to which an impurity element is introduced to be a source or a drain. In addition, as shown in FIG. 2B, a structure in which a third impurity region to which an impurity element is introduced at low concentration is provided only on the second region side, within a region which overlaps with the gate in the semiconductor layer in the transistor can be employed.

Note that the contents described in each drawing in this embodiment mode can be freely combined or replaced with the contents described in another embodiment mode.

Embodiment Mode 2

In this embodiment mode, the structure of the semiconductor device provided with the diode-connected transistor which is described in the above embodiment mode will be described. The diode-connected transistor is used for a rectifier circuit in the semiconductor device.

Figure 6:
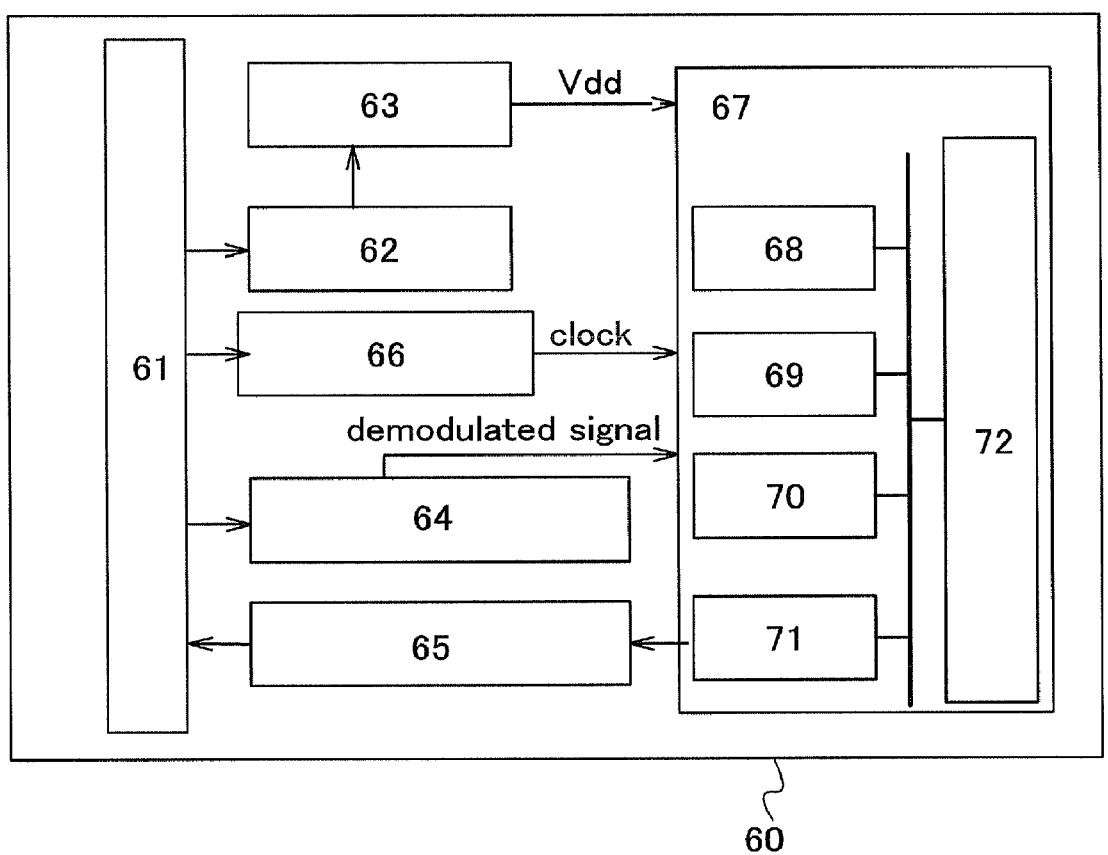
FIG. 6 is a diagram for describing Embodiment Mode 2.

A semiconductor device 60 shown in FIG. 6 has a function of data communication without contact and includes an antenna 61, a rectifier circuit 62, a constant voltage circuit 63, a demodulation circuit 64, a modulation circuit 65, a clock generating circuit 66, and a logic circuit 67. In addition, the logic circuit 67 is provided with, for example, a code extracting circuit 68, a code judging circuit 69, a CRC judging circuit 70, an output unit circuit 71, and a memory circuit 72. The antenna 61 receives a wireless signal, which is propagated through space, and outputs an AC signal. In addition, the rectifier circuit 62 converts the AC signal received at the antenna 61 to a DC signal. The constant voltage circuit 63 generates power supply voltage Vdd from the DC signal. The clock generating circuit 66 generates various clock signals based on the wireless signal received at the antenna 61. The demodulation circuit 64 demodulates the AC signal and output the AC signal to the logic circuit 67. The modulation circuit 65 modulates the signal received from the logic circuit 67, and outputs the modulated signal to the antenna 61. Moreover, in the logic circuit 67, the code extracting circuit 68 extracts a plurality of codes included in a command transmitted to the logic circuit 67; the code judging circuit 69 compares the extracted code and a code corresponding to a reference and judges a content of the command; the CRC judging circuit 70 detects existence or nonexistence of a transmission error or the like in accordance with the judged code; and the output unit circuit 71 encodes the signal output from the logic circuit and outputs the encoded signal.

Next, an example of operation of the above-described semiconductor device 60 will be described. First, the antenna 61 receives a wireless signal from an external communication device, and an AC signal is output to the rectifier circuit 62, the demodulation circuit 64, and the clock generating circuit 66. An output signal from the rectifier circuit 62 is input to the constant voltage circuit 63. A demodulated signal output from the demodulation circuit 64 is transmitted to the logic circuit 67. The demodulated signal is input to the logic circuit 67 and is analyzed by the code extracting circuit 68, the code judging circuit 69, the CRC judging circuit 70, and the like. Then, based on the analyzed signals, information related to the semiconductor device stored in the memory circuit 72 is output. The output information related to the semiconductor device is encoded through the output unit circuit 71. Further, the encoded information related to the semiconductor device 60 passes through the modulation circuit 65 and is transmitted through a wireless signal by the antenna 61. In addition, the DC signal output from the rectifier circuit 62 is supplied to the constant voltage circuit 63. Further, the constant voltage circuit 63 supplies power supply voltage Vdd for operating each circuit of the semiconductor device.

In this manner, data in the semiconductor device 60 can be read by transmission of a signal to the semiconductor device 60 from the communication device and by reception of a signal which is transmitted from the semiconductor device 60 with the communication device. With the rectifier circuit 62 provided with a diode-connected transistor, the semiconductor device 60 can reduce a stress due to a wireless signal with high frequency received at the antenna 61, and can reduce parasitic capacitance generated in the region which overlaps with a gate. Therefore, a semiconductor device in which deterioration in electrical characteristics is little and leakage of an AC signal is suppressed can be obtained.

Note that the contents described in each drawing in this embodiment mode can be freely combined or replaced with the contents described in another embodiment mode.

Embodiment Mode 3

In this embodiment mode, an example of manufacturing a transistor included in the semiconductor device described in Embodiment Mode 2 above will be described. In this embodiment mode, a mode is particularly described in which a semiconductor device is provided with a rectifier circuit including a thin film transistor (TFT) which is manufactured using a semiconductor film formed over an insulating substrate.

Figure 7:
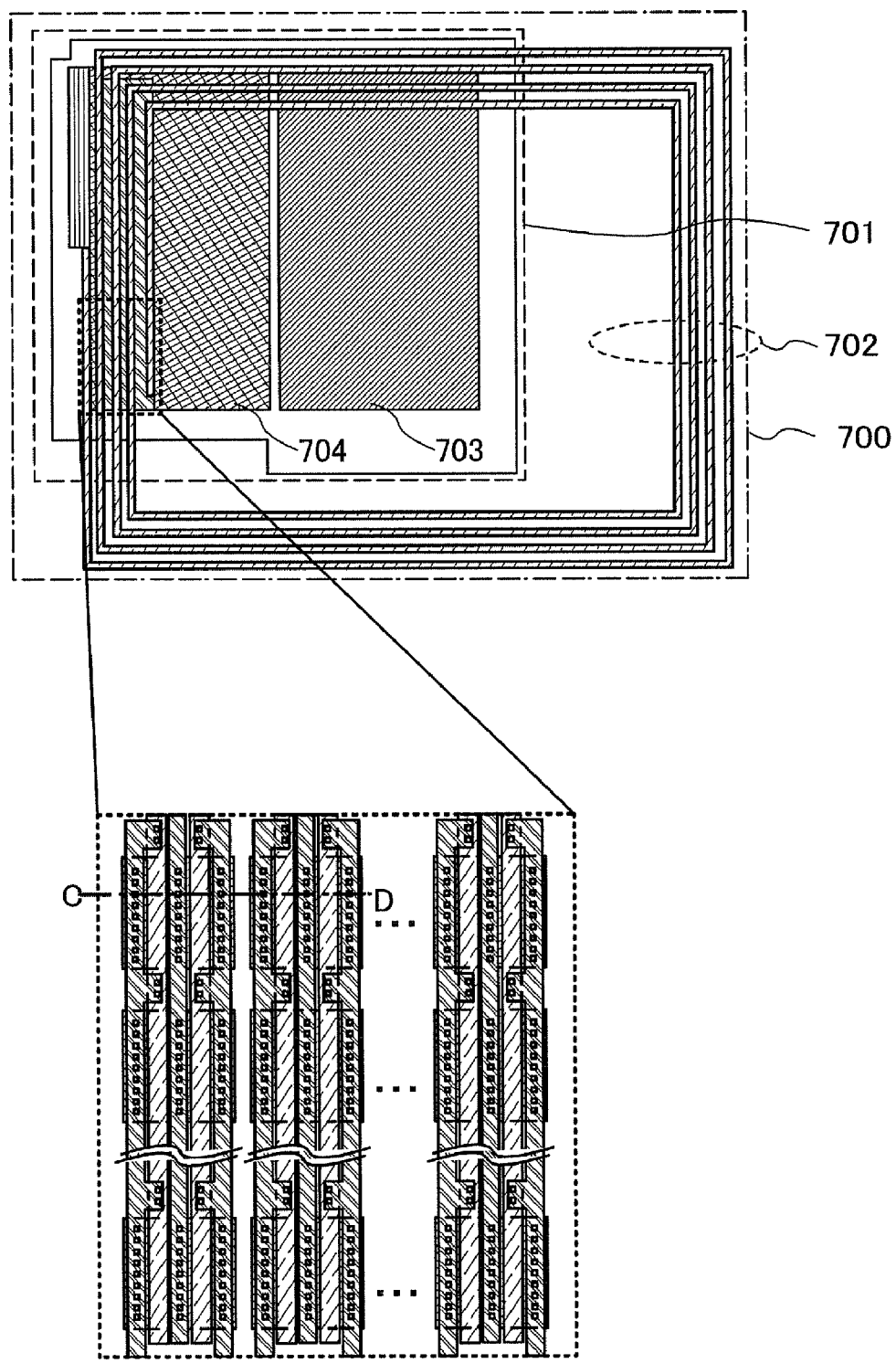
FIG. 7 is a diagram for describing Embodiment Mode 3.

First, one example of a perspective view of the semiconductor device in this embodiment mode is shown in FIG. 7. A semiconductor device 700 shown in FIG. 7 includes an integrated circuit portion 701 and a conductive layer 702 which functions as an antenna. The integrated circuit portion 701 includes a digital circuit portion 703 formed of a logic circuit and an analog circuit portion 704 formed of a rectifier circuit and the like. The conductive layer 702 which functions as an antenna is electrically connected to the integrated circuit portion 701. The structure of the rectifier circuit described in Embodiment Mode 1 above can be applied to the analog circuit portion 704.

In addition, a top view of a transistor which is included in the rectifier circuit is shown in FIG. 7. In this embodiment mode, a cross-sectional view along dash-dotted line C-D of a structure in which a conductive layer serving as an antenna is provided over a plurality of transistors included in the rectifier circuit is shown, and a manufacturing method thereof is described.

Figure 8A:
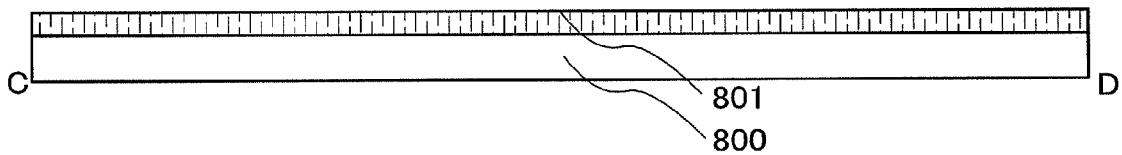
FIGS. 8A to 8E are diagrams for describing Embodiment Mode 3.
Figure 8B:
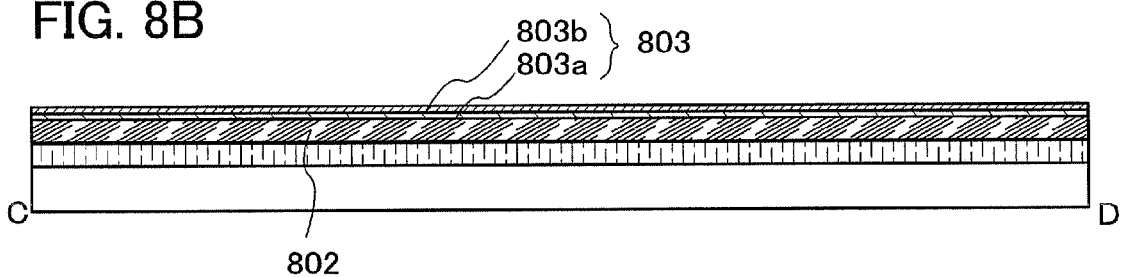

First, an insulating film 802 and a base film 803 including a lower base film 803$a$ and an upper base film 803$b$ are formed (see FIG. 8B) over a substrate 800 including a separation layer 801 (see FIG. 8A).

Any of a glass substrate, a quartz substrate, and a semiconductor substrate may be used as the substrate 800, and a metal film, a metal oxide film, or the like may be used as the separation layer 801. In this embodiment mode, a glass substrate is used as the substrate 800, and a layer in which silicon oxynitride (100 nm) and tungsten (50 nm) are sequentially stacked is used as the separation layer 801.

The insulating film 802 may be one of a silicon oxide film, a silicon nitride oxide film, a silicon nitride film, and a silicon oxynitride film; or a stacked layer of two or more of the above films. In this embodiment mode, a silicon oxynitride film (600 nm) is formed as the insulating film 802.

As the base film 803, a film of stacked layers which are two or more of a silicon oxide film, a silicon oxynitride film, a silicon nitride film, and a silicon nitride oxide film is used. In this embodiment mode, a silicon nitride oxide film (600 nm) is formed as the lower base film 803$a$, and a silicon oxynitride film (100 nm) is formed as the upper base film 803$b$.

Figure 8C:
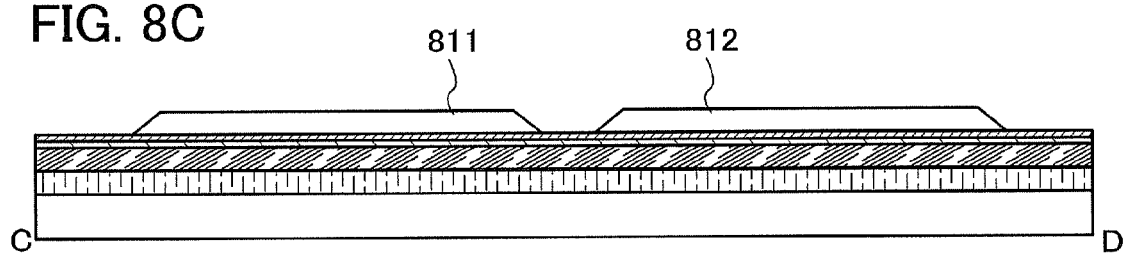

Next, a semiconductor film (66 nm) is formed over the base film 803 and is etched to form an island-shaped semiconductor film 811 and an island-shaped semiconductor film 812 (see FIG. 8C).

Figure 8D:
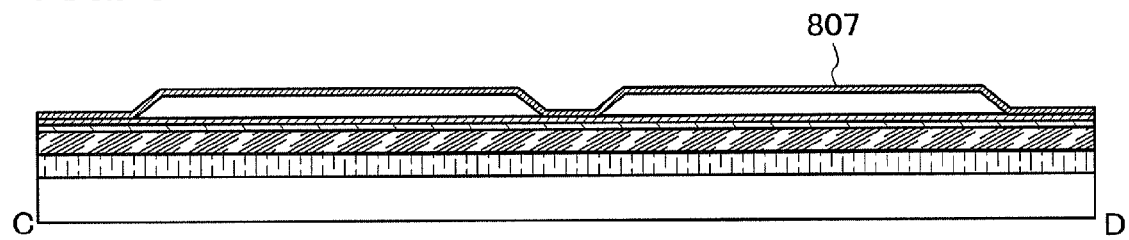

Then, a gate insulating film 807 is formed to cover the base film 803 and the island-shaped semiconductor films 811 and 812 (see FIG. 8D).

As the gate insulating film 807, one of a silicon oxide film, a silicon oxynitride film, a silicon nitride film, and a silicon nitride oxide film; or a stacked layer of two or more of the above films may be used. In this embodiment mode, a silicon oxynitride film (20 nm) is formed as the gate insulating film 807.

Note that a small amount of an impurity element imparting n-type or p-type conductivity can be introduced to the entire surface of the island-shaped semiconductor films 811 and 812 in advance so that the threshold voltage of the transistor formed later is controlled. In this embodiment mode, boron which is an impurity element imparting p-type conductivity is introduced to the island-shaped semiconductor films 811 and 812 under a condition of an application voltage of 15 kV by using diborane which is diluted to 7.5% so as to make the concentration of the impurity element $3.0 \times 10^{17}$ cm$^{-3}$.

Figure 8E:
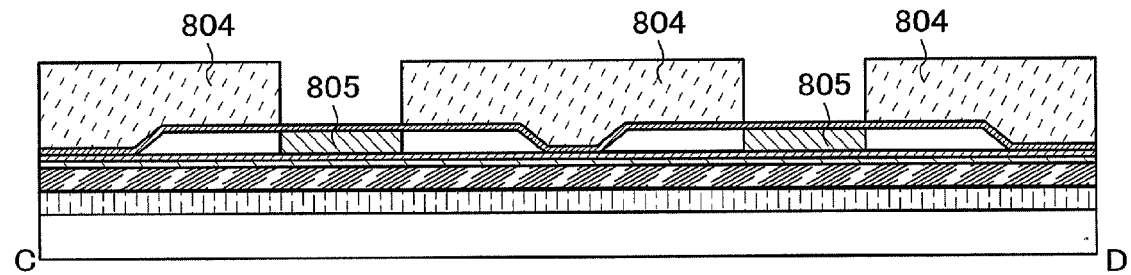

A resist 804 is formed over the island-shaped semiconductor films 811 and 812, with the gate insulating film 807 interposed therebetween, by a photolithography method. Then, an impurity element imparting n-type conductivity is introduced to form a low-concentration impurity region 605. Part of the low-concentration impurity region is a region which is to be a third region (see FIG. 8E). In this embodiment mode, phosphorus which is an impurity element imparting n-type conductivity is introduced to the island-shaped semiconductor films 811 and 812 under a condition of an application voltage of 30 kV by using phosphine which is diluted to 5% so as to make the concentration of the impurity element $1.9 \times 10^{18}$ cm$^{-3}$.

A gate electrode 813 and a gate electrode 814 are formed over the island-shaped semiconductor film 811 and the island-shaped semiconductor film 812 with the gate insulating film 807 interposed therebetween. In this embodiment mode, a stacked layer of a tantalum nitride film (30 nm) and a tungsten film (150 nm) is used for the gate electrodes 813 and 814.

Figure 9A:
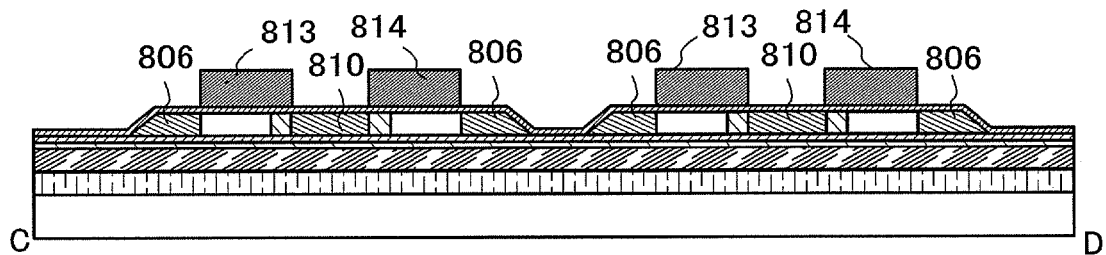
FIGS. 9A to 9E are diagrams for describing Embodiment Mode 3.

Next, an impurity element imparting n-type conductivity is introduced to each of the island shaped semiconductor films 811 and 812 through the gate insulating film 807 with the gate electrodes 813 and 814 as masks so that regions to be source and drain regions of a transistor are formed. These regions are to be first regions 806 and a second region 810 (see FIG. 9A). In this embodiment mode, phosphorus which is an impurity element imparting n-type conductivity is introduced to the island-shaped semiconductor films 811 and 812 under a condition of an application voltage of 15 kV by using phosphine which is diluted to 5% so as to make the concentration of the impurity element $1.0 \times 10^{21}$ cm$^{-3}$. In addition, heat treatment for activating the impurity element introduced to the island-shaped semiconductor films 811 and 812 is performed. As the heat treatment for activation, RTA (rapid thermal anneal) is performed at a temperature of 650° C. for 6 minutes.

Figure 9B:
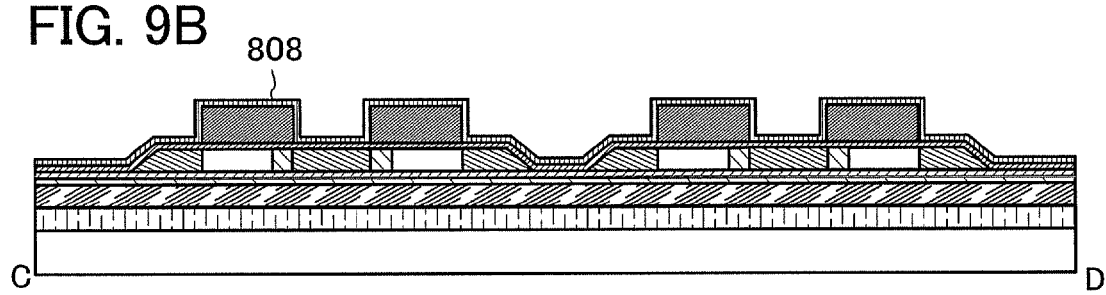

Next, a passivation film 808 is formed to cover the base film 803, the gate insulating film 807, and the gate electrodes 813 and 814 (see FIG. 9B). As the passivation film 808, one of a silicon oxide film, a silicon oxynitride film, a silicon nitride film, and a silicon nitride oxide film; or a stacked layer of two or more of the above films may be used. In this embodiment mode, a silicon oxynitride film (50 nm) is formed as the passivation film 808.

Figure 9C:
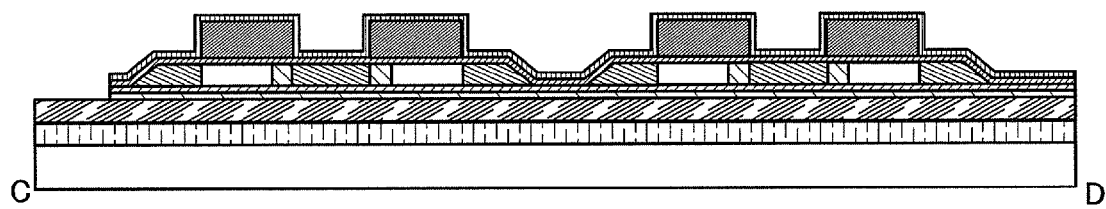

Then, the base film 803, the gate insulating film 807, and the passivation film 808 are etched (see FIG. 9C).

Figure 9D:
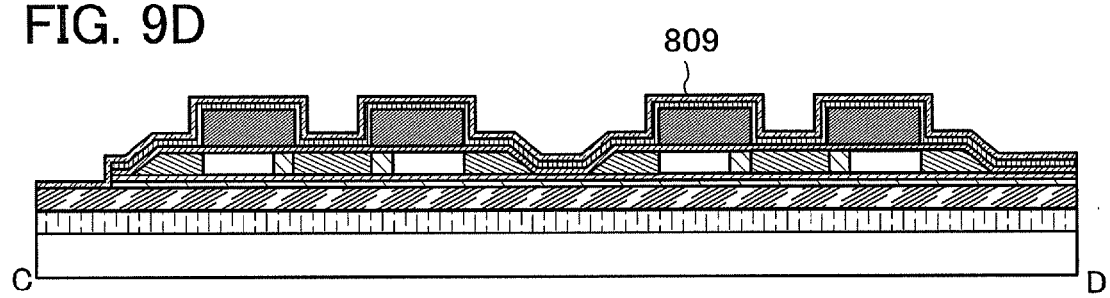

Next, an interlayer insulating film 809 is formed to cover the base film 803, the gate insulating film 807, and the passivation film 808 which have been etched (see FIG. 9D). In this embodiment mode, a silicon nitride oxide film (200 nm) is formed as the interlayer insulating film 809.

Figure 9E:
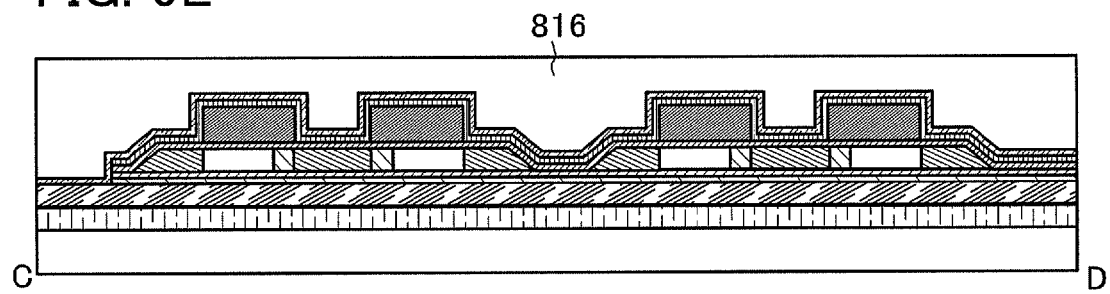

Next, an interlayer insulating film 816 is formed over the interlayer insulating film 809 (see FIG. 9E). In this embodiment mode, a silicon oxynitride film (400 nm) is formed as the interlayer insulating film 816.

Figure 10A:
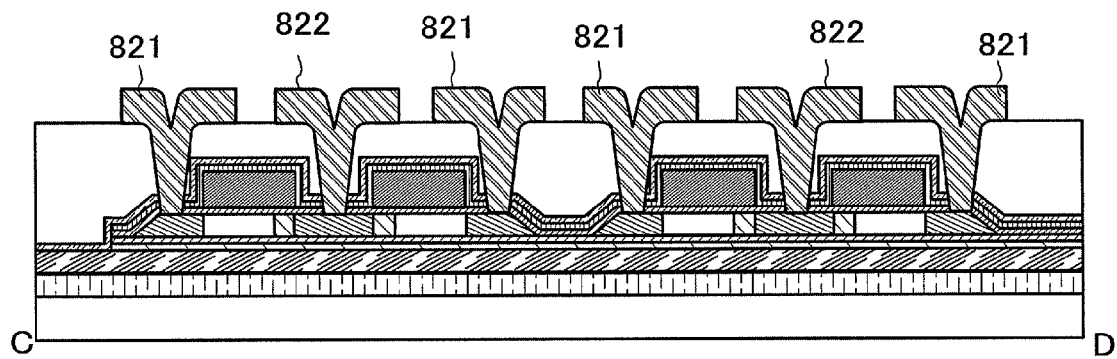
FIGS. 10A to 10C are diagrams for describing Embodiment Mode 3.

A first electrode 821, which is electrically connected to one of the first regions 806, and a second electrode 822 which is electrically connected to the second region 810 are formed over the interlayer insulating film 816 (see FIG. 10A). In this manner, a thin film transistor (TFT) is formed.

Note that in this embodiment mode, each of the first electrode 821 and the second electrode 822 is formed using a three-layer structure film of a titanium film (100 nm), an aluminum film (300 nm), and a titanium film (100 nm).

Then, the substrate 800 and the entire layered structure over the substrate 800 are heated, hydrogen is released from the interlayer insulating film 809, the island-shaped semiconductor films 811 and 812 are hydrogenated, and thus, dangling bonds in the island-shaped semiconductor films 811 and 812 are terminated.

Figure 10B:
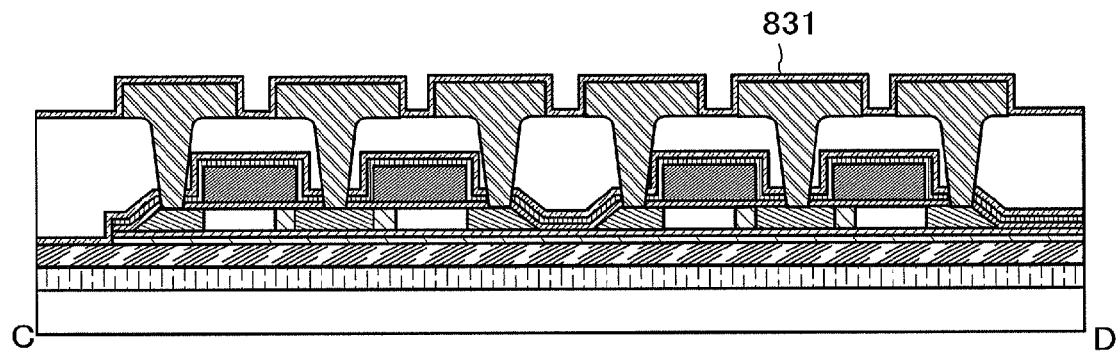

Next, an interlayer insulating film 831 is formed by using a silicon nitride film (100 nm) so as to cover the interlayer insulating film 816, the first electrode 821, and the second electrode 822 (see FIG. 10B).

Figure 10C:
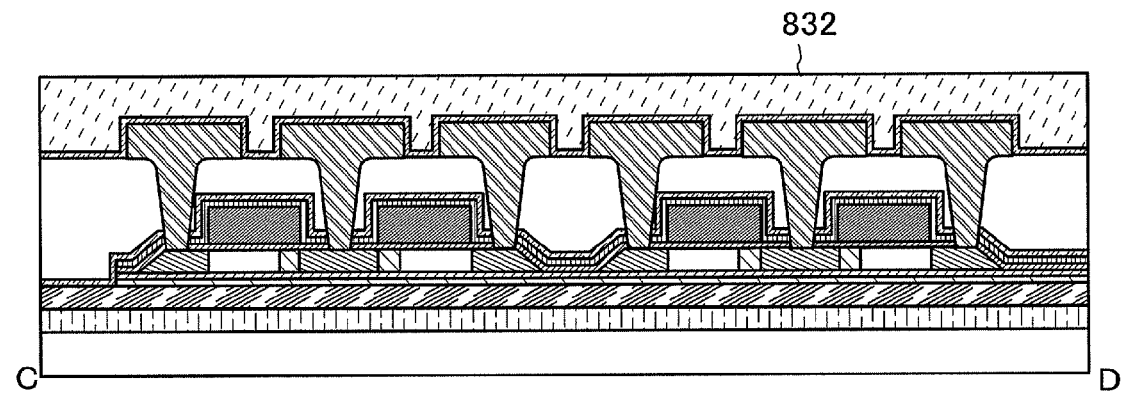

Then, an interlayer insulating film 832 is formed with an organic resin (see FIG. 10C). In this embodiment mode, polyimide (1.5 μm) is used as a material of the interlayer insulating film 832.

Figure 11A:
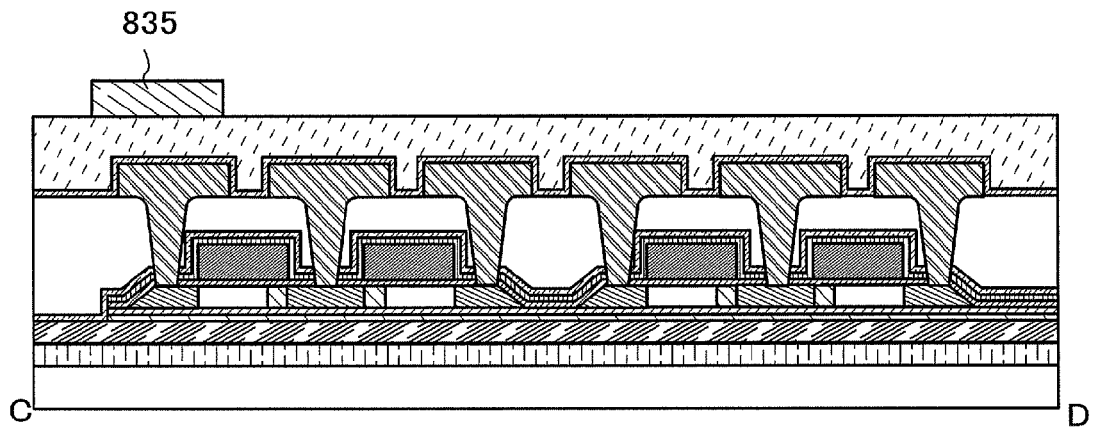
FIGS. 11A to 11C are diagrams for describing Embodiment Mode 3.

A wiring layer 835 for electrical connection of the first electrode 821 and the second electrode 822 is formed over the interlayer insulating film 832 (see FIG. 11A). In this embodiment mode, the wiring layer 835 is formed using a stacked layer of a titanium film (100 nm), an aluminum film (200 nm), and a titanium film (100 nm).

Figure 11B:
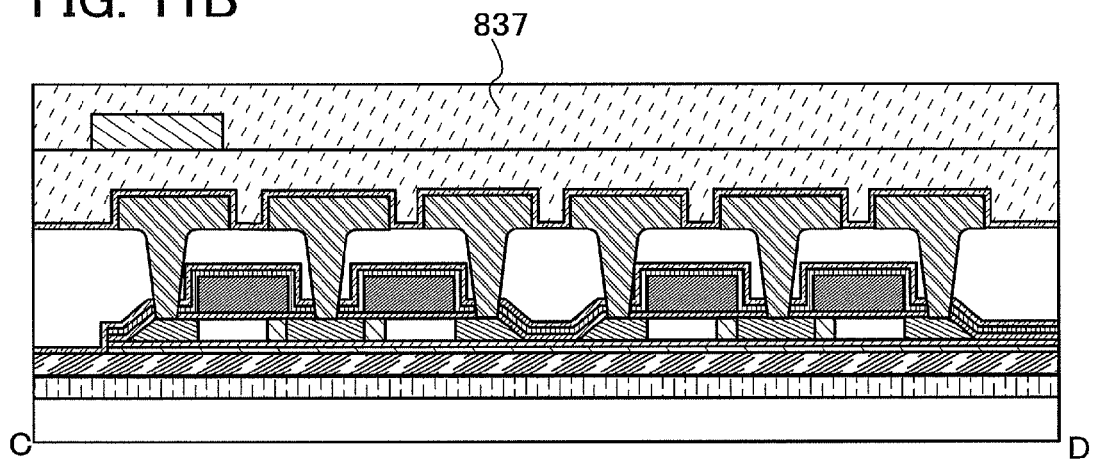

Then, an interlayer insulating film 837 is formed so as to cover the interlayer insulating film 832 and the wiring layer 835 by using an organic resin (see FIG. 11B). In this embodiment mode, polyimide (1.5 μm) is used as a material of the interlayer insulating film 837.

Figure 11C:
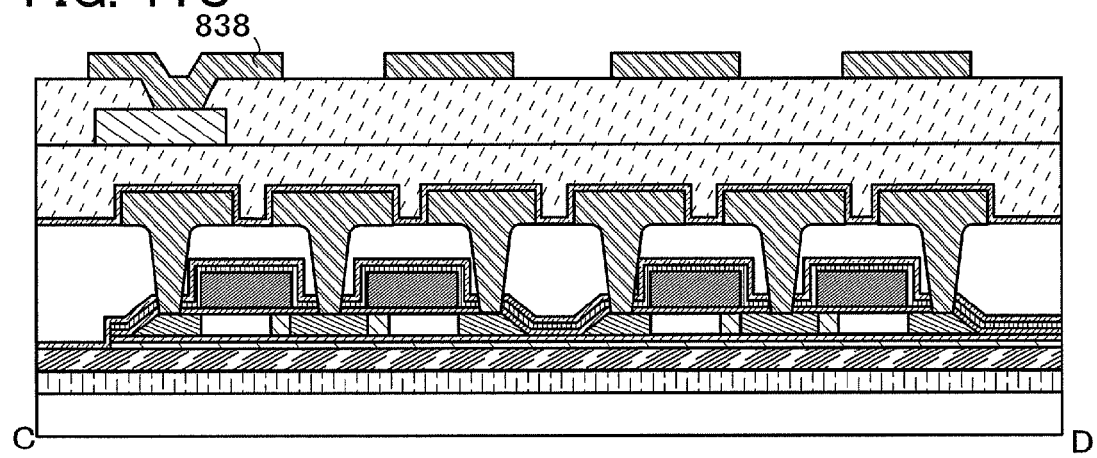

An antenna 838 which is electrically connected to the wiring layer 835 is formed over the interlayer insulating film 837 (see FIG. 11C). In this embodiment mode, the antenna 838 is formed using a stacked layer of a titanium film (100 nm) and an aluminum film (2000 nm).

Note that any of the above-described interlayer insulating films and passivation films can be omitted as appropriate.

Figure 12:
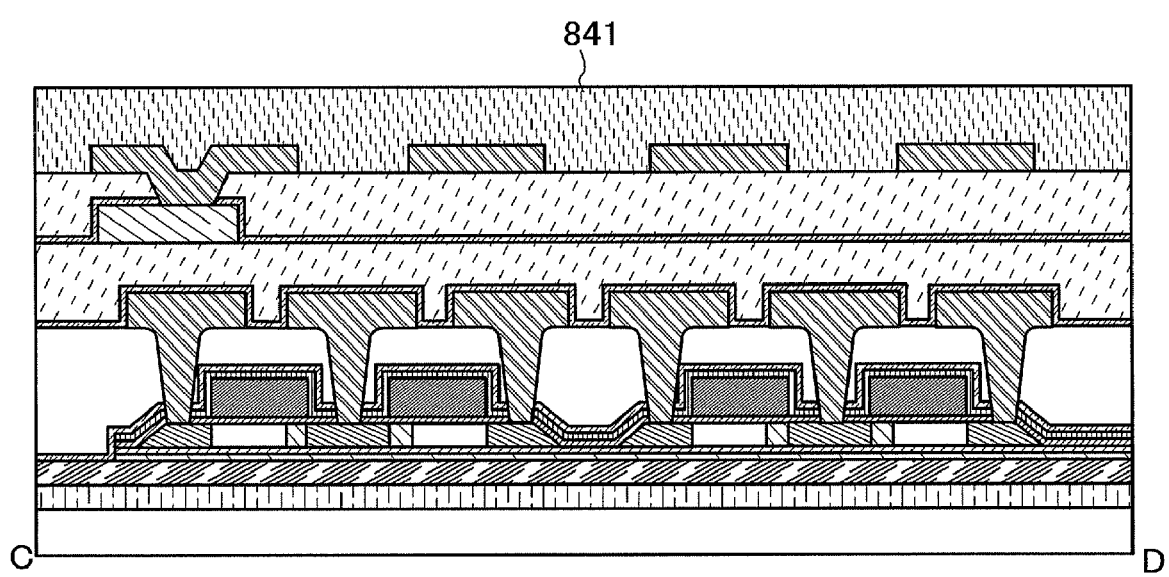
FIG. 12 is a diagram for describing Embodiment Mode 3.

Next, a sealing layer 841 including a fibrous body and an organic resin layer is bonded to the antenna 838 by pressing (see FIG. 12).

The sealing layer 841 includes a fibrous body and an organic resin layer. The fibrous body is a woven fabric or a nonwoven fabric which uses high-strength fiber of an organic compound or an inorganic compound. High-strength fiber is specifically fiber with a high elastic modulus in tension or fiber with a high Young's modulus. As typical examples of high-strength fiber, polyvinyl alcohol fiber, polyester fiber, polyamide fiber, polyethylene fiber, aramid fiber, polyparaphenylene benzobisoxazole fiber, glass fiber, carbon fiber, and the like can be given. As the glass fiber, glass fiber using E glass, S glass, D glass, Q glass, or the like can be used. Note that the fibrous body may be formed from one kind of the above-described high-strength fibers or a plurality of the above-described high-strength fibers.

When a carbon fiber is used as the fibrous body so that the fibrous body is electrically conductive, electrostatic discharge can be reduced.

The fibrous body may be formed using a woven fabric which is woven using bundles of fiber (single yarn) (hereinafter, referred to as yarn bundles) for warp yarns and weft yarns, or a nonwoven fabric obtained by stacking yarn bundles of plural kinds of fiber in a random manner or in one direction.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in cross section. Further, by using a loosely twisted yarn as the yarn bundle of fibers, the yarn bundle is easily flattened and has an elliptical shape or a flat shape in cross section. Use of a yarn bundle having an elliptical shape or a flat shape in cross section in this manner can make the thickness of the fibrous body small. Accordingly, the thickness of the sealing layer can be made small, and a thin semiconductor device can be manufactured. Although the diameter of the yarn bundle is preferably 4 to 400 μm, more preferably 4 to 200 μm, it is theoretically possible that the diameter of the yarn bundle is even smaller. Moreover, although the thickness of the fiber is preferably 4 to 20 μm, it is theoretically possible that the thickness of the fiber is even smaller, and the thickness of the fiber depends on a material of the fiber.

Figure 13A:
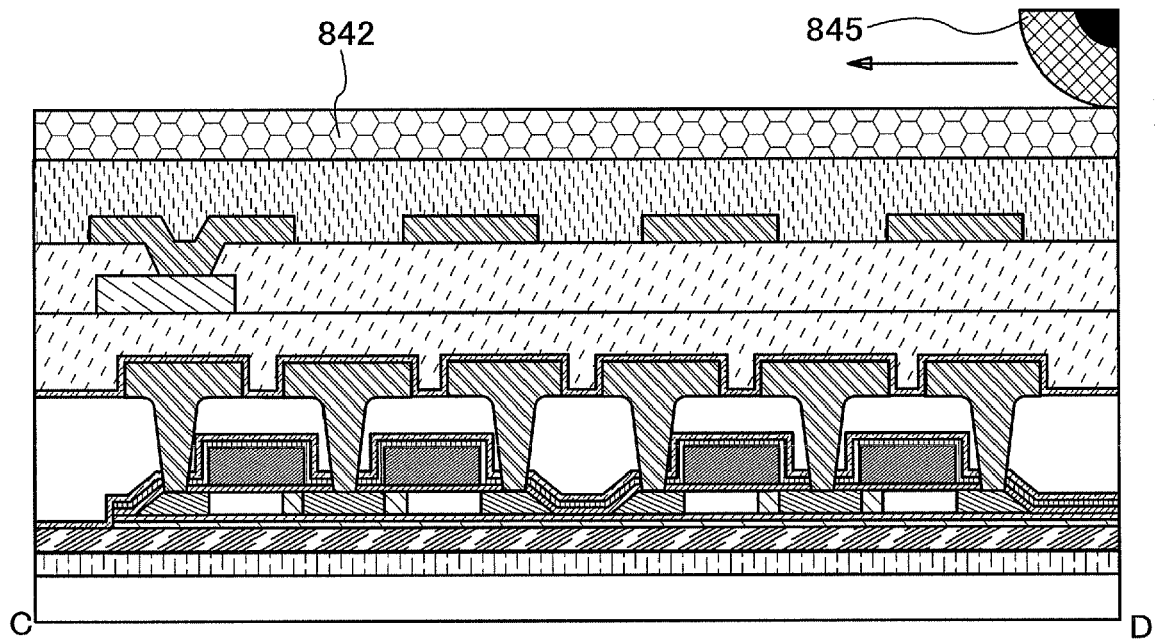
FIGS. 13A and 13B are diagrams for describing Embodiment Mode 3.
Figure 13B:
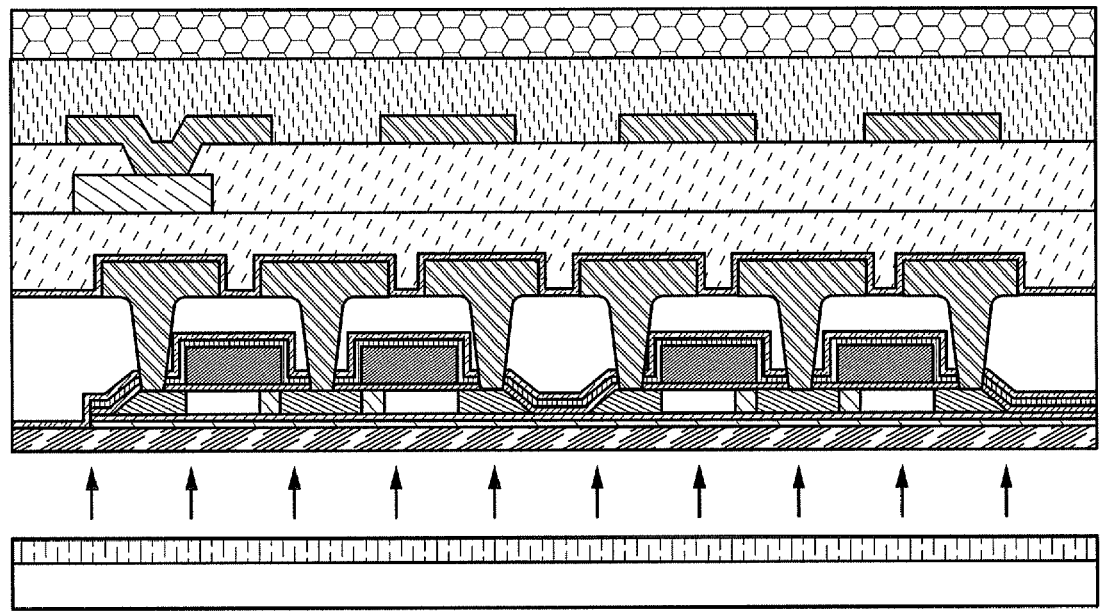

Next, an adhesive tape 842 which can be separated by light or heat is provided over the sealing layer 841. Then, the separation layer 801 is separated while a roller 845 rotates on the adhesive tape 842 (see FIG. 13A), so that the substrate 800 is separated (see FIG. 13B).

Figure 14A:
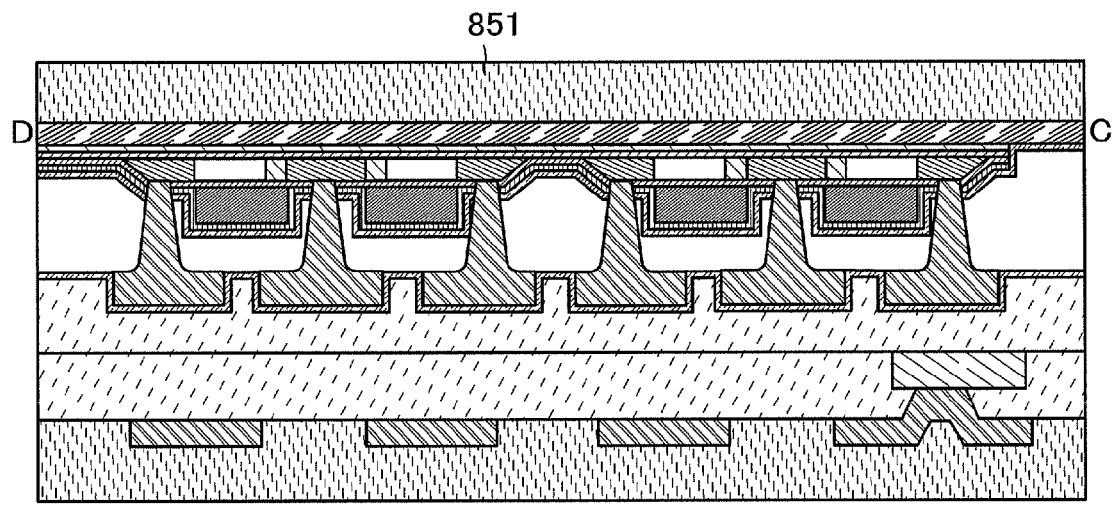
FIGS. 14A and 14B are diagrams for describing Embodiment Mode 3.

Next, a sealing layer 851 including a fibrous body and an organic resin layer is provided to be in contact with the insulating film 802 and is bonded to the insulating film 802 by pressing (see FIG. 14A). Note that the adhesive tape 842 may be separated before or after the sealing layer 851 is provided.

Figure 14B:
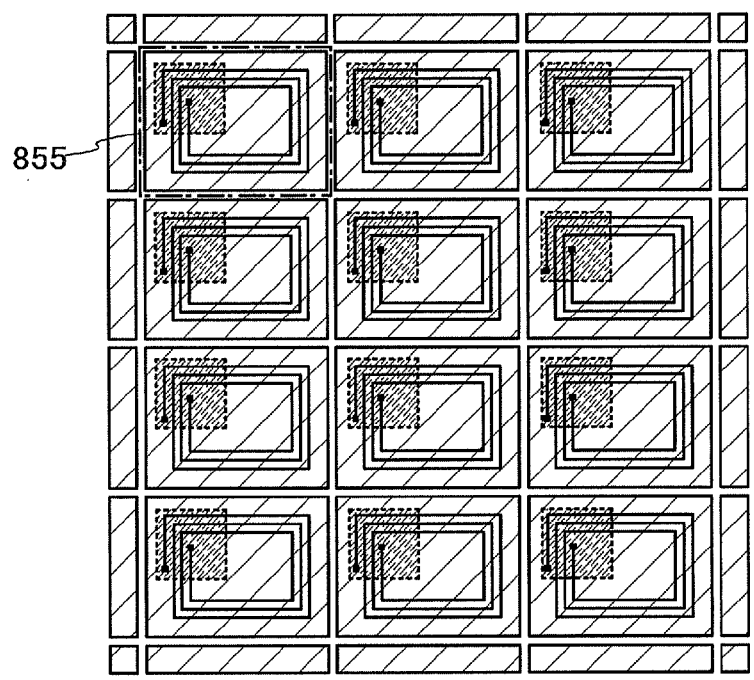

Then, a region between elements is irradiated with a laser (not shown) so that the elements are separated and chips are cut out. Accordingly, a plurality of semiconductor devices 855 can be obtained (see FIG. 14B).

The description above is one example of manufacturing a semiconductor device.

In this embodiment mode, a TFT can be surrounded by the lower base film 803a, the upper base film 803b, and the interlayer insulating film 809, whereby impurity contamination can be further suppressed, and a semiconductor device with higher reliability can be obtained.

Note that in this embodiment mode, an example in which an antenna and a TFT are formed over one substrate is described; however, the semiconductor device of this embodiment mode is not limited thereto. After formation of the TFT, an antenna which is separately formed may be electrically connected to an integrated circuit. In this case, the antenna and the integrated circuit can be electrically connected to each other by being pressure-bonded with an anisotropic conductive film (ACF), anisotropic conductive paste (ACP), or the like. In addition, connection can be performed by using a conductive adhesive agent such as a silver paste, a copper paste, or a carbon paste; by using solder bonding; or the like.

As described above, the semiconductor device includes the semiconductor layer provided with the first and second regions to which an impurity element, which is for making the first and second regions a source and a drain, is introduced, the third region, and the channel region, and a gate electrode which is provided so as to partly overlap with the semiconductor layer with the gate insulating film interposed therebetween. In the semiconductor layer, the first region is electrically connected to the gate electrode through the first electrode to which an AC signal is input; the second region is electrically connected to the capacitor element through the second electrode; and the third region includes a region provided to overlap with the gate electrode and contains an impurity element at a lower concentration than the first region and the second region. In this manner, with the provision of the rectifier circuit including the diode-connected transistor, a stress due to a wireless signal with high frequency, which is received at the antenna, can be reduced and parasitic capacitance generated in the region which overlaps with a gate can be reduced. Therefore, a semiconductor device in which deterioration in electrical characteristics is little and leakage of an AC signal is suppressed can be obtained.

Note that the contents described in each drawing in this embodiment mode can be freely combined or replaced with the contents described in another embodiment mode.

Embodiment Mode 4

In this embodiment mode, a manufacturing method for a transistor included in the semiconductor device described in Embodiment Mode 2 will be described. In this embodiment mode, a mode is specifically described in which a single crystal semiconductor is used for a semiconductor film over an insulating substrate, which is used for manufacturing a transistor of a semiconductor device.

Hereinafter, in this embodiment mode, a method for manufacturing an insulating substrate on which a single crystal semiconductor is formed (hereinafter referred to as an SOI (silicon on insulator) substrate) will be described.

Figure 15A:
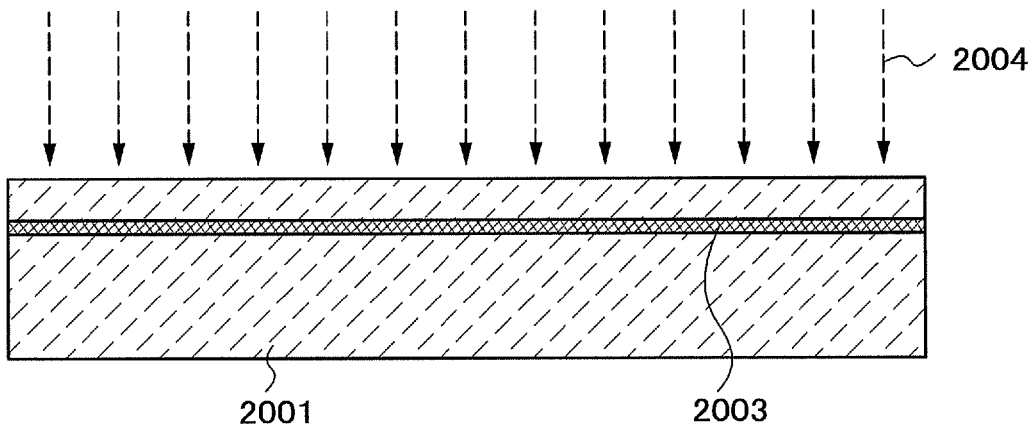
FIGS. 15A to 15C are diagrams for describing Embodiment Mode 4.

First, a semiconductor substrate 2001 is prepared (see FIG. 15A and FIG. 17A). As the semiconductor substrate 2001, a commercial semiconductor substrate such as a silicon substrate, a germanium substrate, or a compound semiconductor substrate of a gallium arsenide, indium phosphide, or the like may be used. Typical sizes of the commercial silicon substrate are 5 in. (125 mm), 6 in. (150 mm), 8 in. (200 mm), and 12 in. (300 mm) in diameter, and most of the commercial silicon substrates are circular. Further, the film thickness can be determined up to about 1.5 mm as appropriate.

Next, ions 2004 that are accelerated by application of an electric field are implanted at a predetermined depth from the surface of the semiconductor substrate 2001 to form an ion-doped layer 2003 (see FIG. 15A and FIG. 17A). The ions 2004 are implanted in consideration of the thickness of an SOI layer which is transferred to a base substrate later. It is preferable that the SOI layer have a thickness of 5 to 500 nm, more preferably, 10 to 200 nm. Acceleration voltage and the dose of the ions in ion implantation are selected as appropriate in consideration of the thickness of the SOI layer to be transferred. As the ions 2004, ions of halogen such as hydrogen, helium, or fluorine can be used. Note that as the ion 2004, it is preferable to implant an ion species including an atom or a plurality of the same atoms formed by exciting a source gas selected from hydrogen, helium, and a halogen element with plasma. When a hydrogen ion is implanted, it is preferable that $H^+$, $H_2^+$, and $H_3^+$ ions be contained and the $H_3^+$ ion be contained at a higher percentage because efficiency of ion implantation can be improved and the time of ion implantation can be reduced. Further, such a structure enables easy separation.

In order to form the ion-doped layer 2003 at a predetermined depth, the ions 2004 need to be implanted at a high dose rate in some cases. At this time, a surface of the semiconductor substrate 2001 may be rough depending on a condition. Therefore, a silicon nitride layer, a silicon nitride oxide layer, or the like with a thickness of 50 to 200 nm may be provided as a protective layer on the surface of the semiconductor substrate, to which the ions are implanted.

Figure 15B:
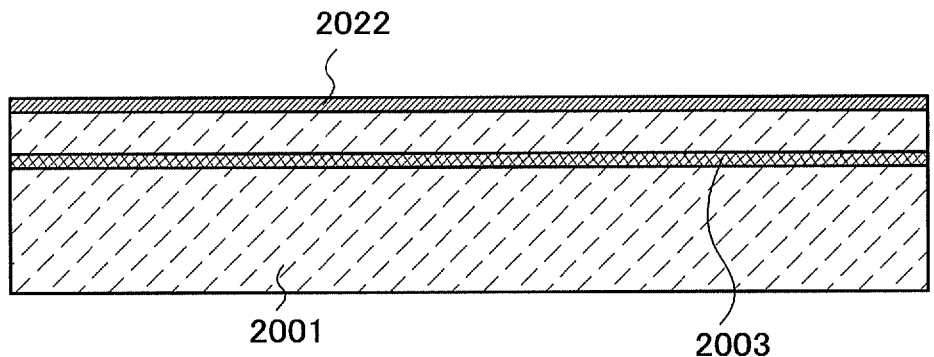
Figure 17B:
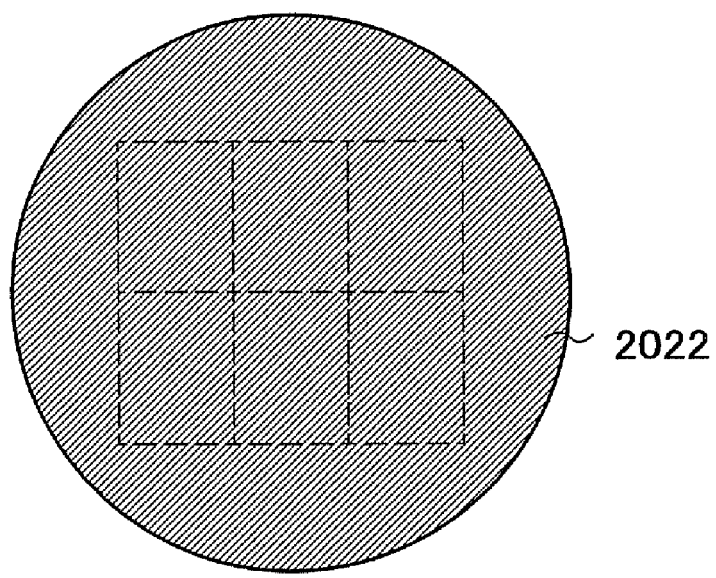

Next, a bonding layer 2022 is provided for the semiconductor substrate 2001 (see FIG. 15B and FIG. 17B). The bonding layer 2022 is formed over a surface of the semiconductor substrate 2001 which is to be bonded to a base substrate. Here, as the bonding layer 2022, a silicon oxide layer formed by a chemical vapor deposition method using an organosilane gas as a material gas is preferably used. It is also possible to use a silicon oxide layer formed by a chemical vapor deposition method using silane as a source gas. Film formation by a chemical vapor deposition method is performed at a temperature, for example, 350° C. or lower, at which degassing of the ion-doped layer 2003 that is formed in the semiconductor substrate 2001 does not occur. Note that a heat treatment temperature higher than the film formation temperature by a chemical vapor deposition method is applied to heat treatment for separating the SOI layer from the semiconductor substrate such as a single crystal semiconductor substrate or a polycrystalline semiconductor substrate.

Figure 15C:
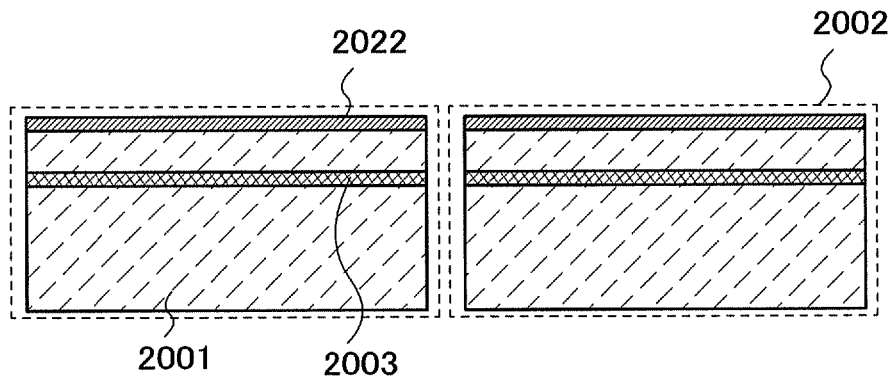
Figure 17C:
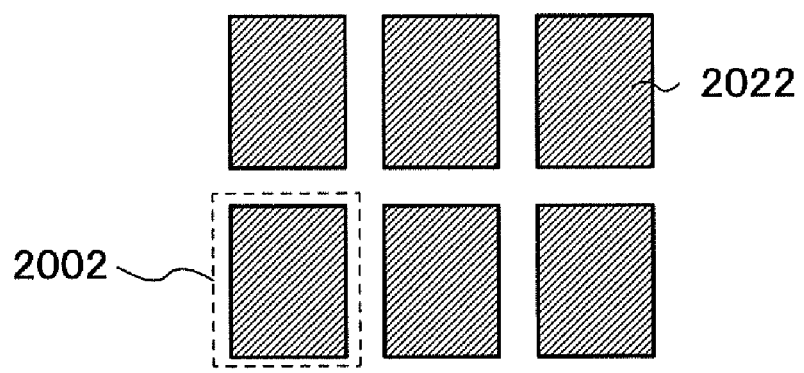

Next, the semiconductor substrate 2001 is processed into a predetermined size and shape (see FIG. 15C and FIG. 17C). Specifically, the semiconductor substrate 2001 is processed to have a desired size. In FIG. 17C, the case where the circular semiconductor substrate 2001 is divided to form a rectangular semiconductor substrate 2002 is shown. At this time, the bonding layer 2022 and the ion-doped layer 2003 are also cut. That is, the semiconductor substrates 2002 each of which has a desired size, in each of which the ion-doped layer 2003 is formed at a given depth, and each of which has a surface (a bonding surface which is to be bonded to a base substrate) is provided with the bonding layer 2022 are obtained.

The semiconductor substrate 2002 is preferably cut in advance to have the size of a desired semiconductor device. The semiconductor substrate 2001 can be divided with a cutting apparatus such as a dicer or a wiresaw, a laser, plasma, an electronic beam, or any other cutting means.

Note that an order of steps up to provision of the bonding layer on the surface of the semiconductor substrate can be permuted as appropriate. In FIGS. 15A to 15C and FIGS. 17A to 17C, the example in which the ion-doped layer is formed in the semiconductor substrate, the bonding layer is formed over the surface of the semiconductor substrate, and then, the semiconductor substrate is processed into a desired size is shown. Alternatively, for example, the following sequence can also be used; the semiconductor substrate is processed into a desired size, the ion-doped layer is formed in the semiconductor substrate with the desired size, and then, the bonding layer is formed over the surface of the semiconductor with the desired size.

Figure 16A:
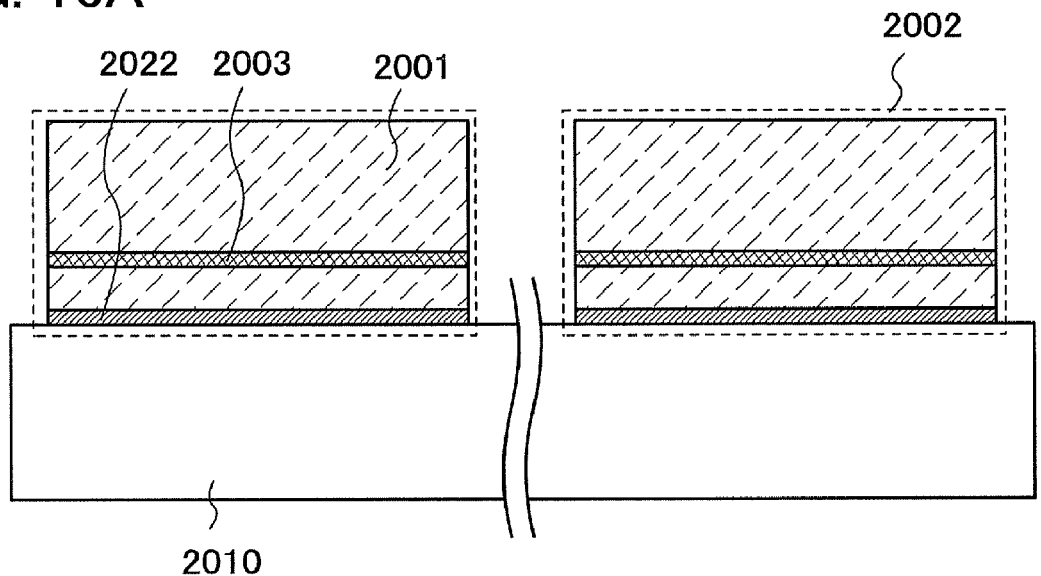
FIGS. 16A and 16B are diagrams for describing Embodiment Mode 4.

Then, the base substrate 2010 and the semiconductor substrate 2002 are attached to each other. FIG. 16A shows an example in which the base substrate 2010 is made in close contact with the surface of the semiconductor substrate 2002, where the bonding layer 2022 is formed, to bond the two to each other. Note that it is preferable that the surface to be bonded (bonding surface) be cleaned sufficiently. By placing the base substrate 2010 in close contact with the bonding layer 2022, they are bonded to each other by Van der Waals forces. By pressing the base substrate 2010 and the semiconductor substrate 2002 against each other, they are strongly bonded to each other by hydrogen bonding.

In order to obtain a favorable bond between the base substrate 2010 and the bonding layer 2022, the surface to be bonded may be activated. For example, one or both of the surfaces to be bonded are irradiated with an atomic beam or an ion beam. When an atomic beam or an ion beam is used, an inert gas neutral atom beam or inert gas ion beam of argon or the like can be used. It is also possible to activate the surface, which is to be bonded, by plasma irradiation or radical treatment. Such surface treatment facilitates bonding between different materials even at a temperature of 400° C. or lower.

After the base substrate 2010 and the semiconductor substrate 2002 are attached to each other with the bonding layer 2022 interposed therebetween, it is preferable that heat treatment or pressure treatment be performed. Heat treatment or pressure treatment can increase bonding strength. The heat treatment is preferably performed at a temperature lower than or equal to the upper temperature limit of the base substrate 2010. The pressure treatment is performed so that pressure is applied perpendicularly to the bonding surface, in view of the pressure resistance of the base substrate 2010 and the semiconductor substrate 2002.

Figure 16B:
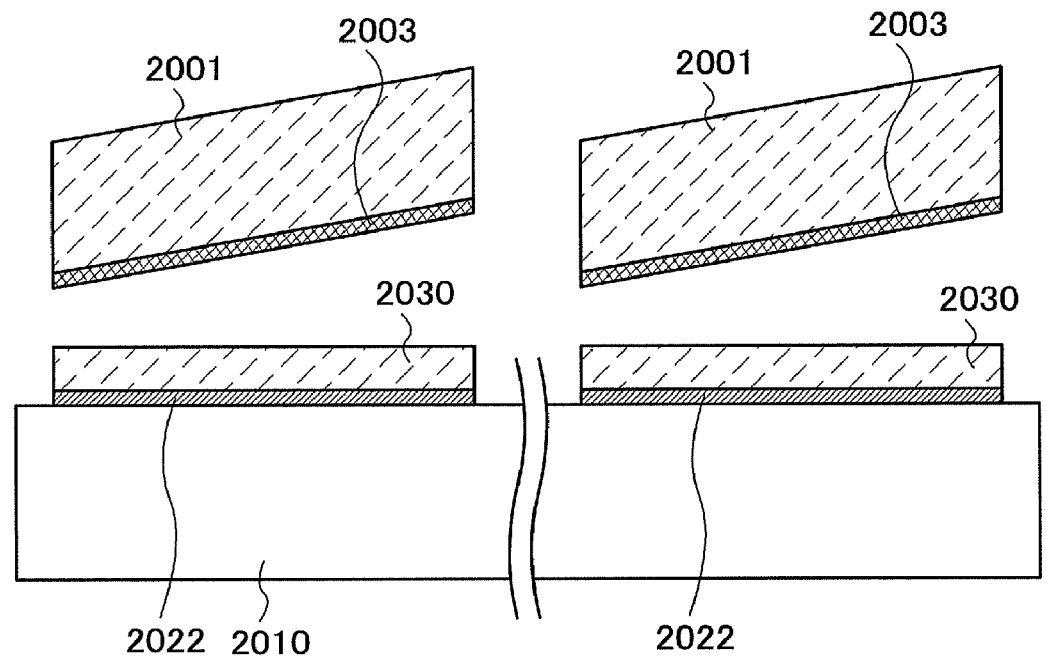

Next, heat treatment is performed to separate part of the semiconductor substrate 2002 from the base substrate 2010 with the ion-doped layer 2003 used as a cleavage plane (see FIG. 16B). The heat treatment is preferably performed at a temperature ranging from the temperature at which the bonding layer 2022 is formed to the upper temperature limit of the base substrate 2010. When the heat treatment is performed at, for example, 400 to 600° C., a change in the volume of fine voids formed in the ion-doped layer 2003 occurs, which enables cleavage to occur along the ion-doped layer 2003. Because the bonding layer 2022 is bonded to the base substrate 2010, an SOI layer 2030 having the same crystallinity as the semiconductor substrate 2002 is left over the base substrate 2010.

Thus, an SOI structure is formed in which the SOI layer 2030 is provided over the base substrate 2010 with the bonding layer 2022 interposed therebetween. Note that the SOI substrate has a structure in which a plurality of SOI layers is provided over one base substrate with the bonding layer interposed therebetween.

It is preferable that SOI layers obtained by separation be subjected to chemical mechanical polishing (CMP) in order to flatten the surfaces. Alternatively, a surface of the SOI layer may be irradiated with a laser beam for flattening without using a physical polishing means such as CMP. Note that irradiation with a laser beam is preferably performed in a nitrogen atmosphere in which oxygen concentration is lower than or equal to 10 ppm. This is because a surface of the SOI layer could possibly be rough if laser beam irradiation is performed in an oxygen atmosphere. Further, CMP or the like may be performed to thin SOI layers obtained.

By the method for manufacturing an SOI substrate, which is described in this embodiment mode, the SOI layer 2030 a bonding portion of which has a high bonding strength can be obtained even in the case where the base substrate 2010 is a glass substrate or the like whose upper temperature limit is lower than or equal to 600° C. Further, since the process may be performed at 600° C. or lower, any of a variety of glass substrates that are used in the electronics industry, called an alkali-free glass substrate, such as aluminosilicate glass substrates, aluminoborosilicate glass substrates, and barium borosilicate glass substrates, can be used as the base substrate 2010. Needless to say, it is also possible to use a ceramic substrate, a sapphire substrate, a quartz substrate, or the like.

In the case of the SOI substrate described in this embodiment mode, a single crystal semiconductor film can be formed directly on an insulating substrate such as a glass substrate; therefore, a crystallization process such as laser crystallization of a semiconductor film for the purpose of improving semiconductor characteristics is not necessary. Thus, since an SOT substrate is manufactured and a transistor and the like are manufactured using the method described in Embodiment Mode 3 so that a semiconductor device can be formed using an element which has a small variation in transistor characteristics, the semiconductor device can be formed to be highly reliable.

Although the structure in which the semiconductor film formed of the single crystal semiconductor is provided on the insulating substrate is employed in this embodiment mode, a mode in which an impurity element is directly introduced to a semiconductor substrate formed of a single crystal semiconductor to form a transistor is also possible.

Note that the contents described in each drawing in this embodiment mode can be freely combined or replaced with the contents described in another embodiment mode.

Embodiment Mode 5

In this embodiment mode, an example of usage patterns of a semiconductor device which is capable of inputting and outputting data without contact will be described. A semiconductor device can be used as a so-called IC label, IC tag, and IC card provided in, for example, bills, coins, securities, bearer bonds, documents (such as driver's licenses or resident's cards), packaging containers (such as wrapping paper or bottles), storage media (such as DVD software or video tapes), vehicles (such as bicycles), personal belongings (such as bags or glasses), foods, plants, animals, human bodies, clothing, commodities, products such as electronic devices, or an article such as shipping tags of baggage. The electronic apparatuses include liquid crystal display devices, EL display devices, television sets (also simply called televisions or television receivers), mobile phones, and the like. Hereinafter, examples of usage patterns of a semiconductor device will be explained with reference to drawings.

Figure 18A:
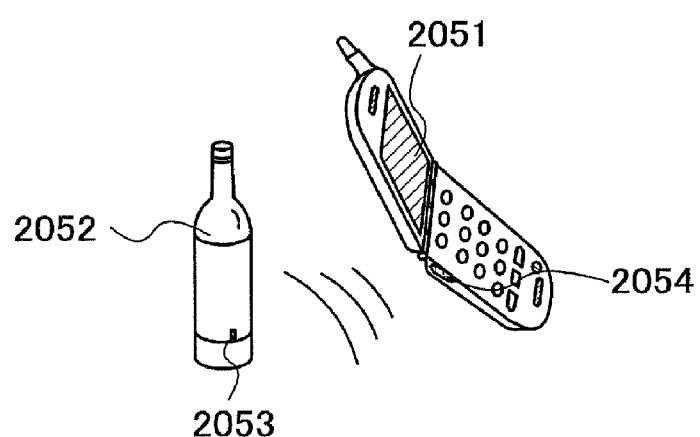
FIGS. 18A and 18B are diagrams for describing Embodiment Mode 5.
Figure 18B:
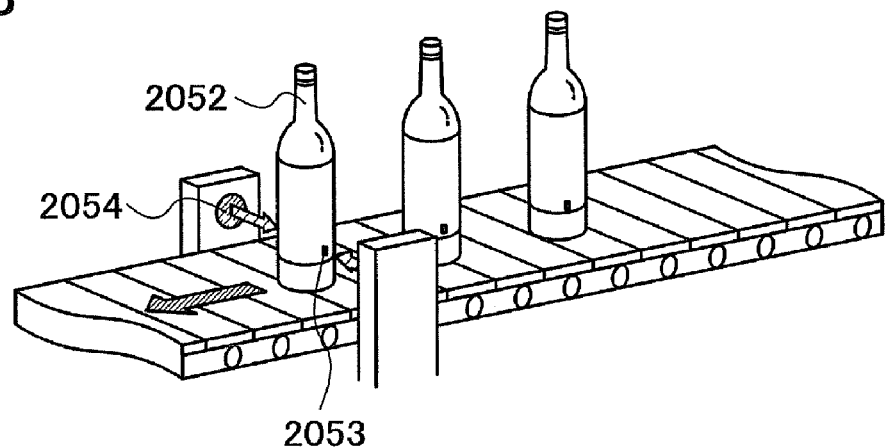

A reader/writer 2054 is provided on the side of a portable terminal including a display portion 2051, and a semiconductor device 2053 is provided on the side of an article 2052 (FIG. 18A). When the reader/writer 2050 is put close to the semiconductor device 2053 on the article 2052, data on the raw material or the place of origin of the article, inspection result in each production step, history of the distribution process, article description, and the like is displayed on the display portion 2051. In addition, by using the reader/writer 2054 and the semiconductor device 2053 provided on the article 2052, the article can be inspected at the time of carrying by a conveyer belt (see FIG. 18B). As the semiconductor device 2053, the semiconductor device described in Embodiment Modes 1 to 4 can be applied. In this manner, by using the semiconductor device in the system, information can be obtained easily and high performance and a high added value are achieved. Moreover, in the semiconductor device, a stress on the diode-connected transistor due to a wireless signal with high frequency can be reduced and parasitic capacitance generated in the region which overlaps with a gate can be reduced. Therefore, the semiconductor device in which deterioration in electrical characteristics is little and leakage of an AC signal is suppressed can be obtained.

Note that an applicable range of the semiconductor device is wide in addition to the above, and the semiconductor device can be applied to any article as long as it clarifies information related to an object, such as the history thereof, without contact and is useful for production, management, or the like. In the semiconductor device, a stress on the diode-connected transistor due to a wireless signal with high frequency can be reduced and parasitic capacitance generated in the region which overlaps with a gate can be reduced. Therefore, the semiconductor device in which deterioration in electrical characteristics is little and leakage of an AC signal is suppressed can be obtained.

Note that the contents described in each drawing in this embodiment mode can be freely combined or replaced with the contents described in another embodiment mode.

Embodiment 1

In this embodiment, an effect in the case where the semiconductor device which utilizes the semiconductor characteristics described in Embodiment Modes 1 to 3 is an IC chip for so-called RFID capable of data communication with a communication device through wireless communication will be described. Hereinafter, a result of inspection of an effect when a stress (hereinafter such a stress is abbreviated as a radio stress) due to a wireless signal with high frequency is applied to a diode-connected transistor in a semiconductor device will be described. First, a result of comparison between characteristics of a semiconductor device provided with a diode-connected transistor having the structure described in Embodiment Modes 1 to 3, and a semiconductor device provided with a transistor having a single-drain structure will be described.

Figure 19A:
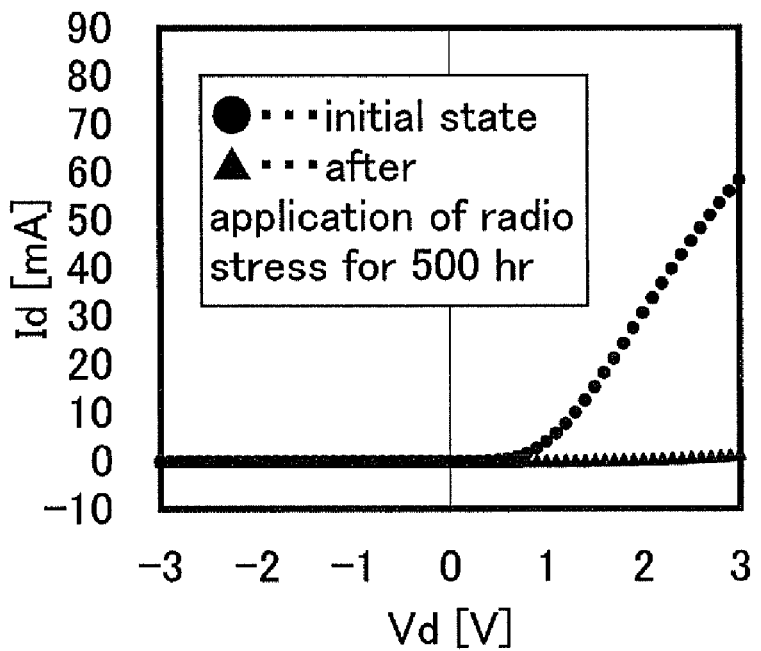
FIGS. 19A and 19B are graphs for describing Embodiment 1.
Figure 19B:
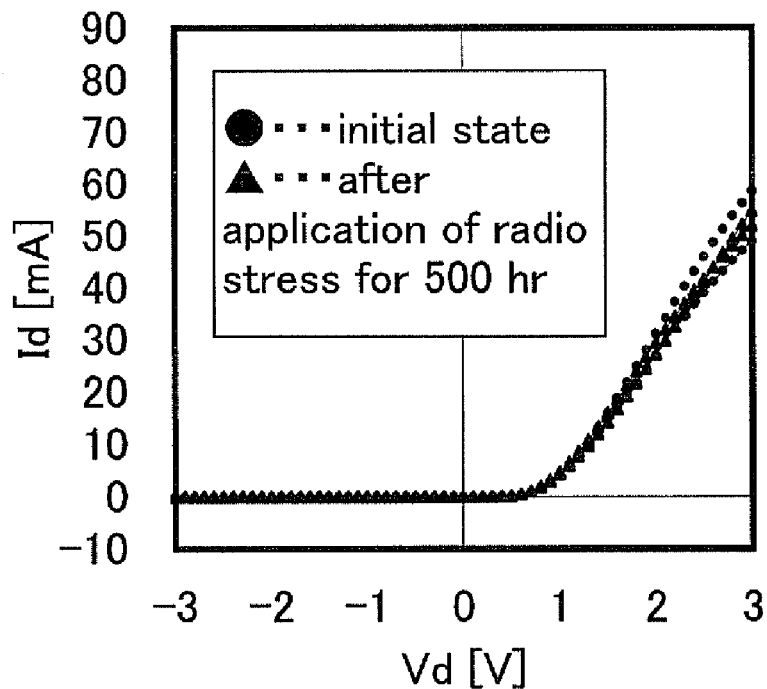

In FIGS. 19A and 19B, comparing the semiconductor device provided with the structure described in Embodiment Modes 1 to 3, and the semiconductor device provided with the transistor having a single-drain structure, initial current-voltage characteristics and current-voltage characteristics after application of a radio stress for 500 hours of the diode-connected transistors are examined.

Here, a transistor described with a graph in FIG. 19A is a transistor with a single-drain structure in which a third region is not formed in the manufacturing method described in Embodiment Mode 3 and has a channel length L of 3.0 μm and a channel width W of 3000 μm. In addition, a transistor described with a graph in FIG. 19B is a transistor manufactured by using the manufacturing method described in Embodiment Mode 3, in which the channel length Li is 2.5 μm, the channel width W is 3000 μm, the length Lov of the third region is 1.0 μm, and the concentration of an impurity element to be introduced to the third region is $1.9 \times 10^{18}$ cm$^{-3}$.

As shown in FIG. 19A, in the case where the transistor with a single-drain structure is used as a diode-connected transistor, the current-voltage characteristic of the diode-connected transistor greatly changes. On the other hand, as shown in FIG. 19B, in the case where the transistor with the structure described in Embodiment Modes 1 to 3 is used as the diode-connected transistor in the rectifier circuit, the result is that the current-voltage characteristic of the diode-connected transistor hardly changes.

Figure 20:
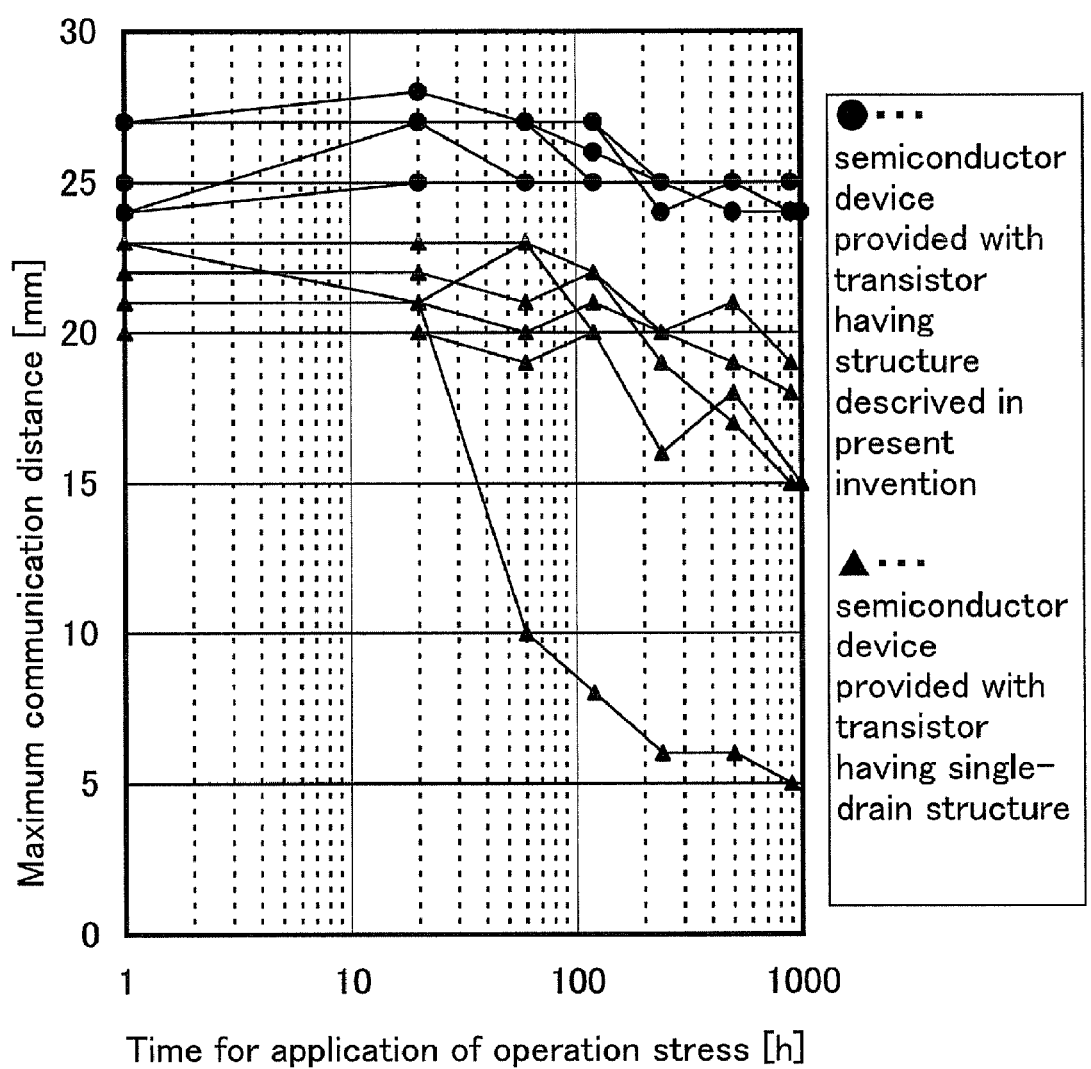
FIG. 20 is a graph for describing Embodiment 1.

In order to illustrate the difference between changes in current-voltage characteristics of the diode-connected transistors shown in FIGS. 19A and 19B, FIG. 20 shows the relationship between a distance from a reader/writer which is a communication device and a time for application of an operation stress, so that the effect of the structure described in Embodiment Modes 1 to 3 will be described. Here, the time for application of an operation stress means a time during which the semiconductor device continuously receives a signal of a radio wave transmitted from the reader/writer.

Note that FIG. 20 shows, for example, a communication distance in the case where a wireless signal of 13.56 MHz is transmitted and received between the reader/writer and the semiconductor device.

As shown in FIG. 20, in the semiconductor device provided with the transistor having a single-drain structure which is described in FIG. 19A, a decrease in the communication distance between the reader/writer and the semiconductor device is observed as the time for application of an operation stress increases. On the other hand, in the semiconductor device provided with the structure of the transistor described in FIG. 19B, it is observed that the change in the maximum communication distance is small even if the time for application of an operation stress increases. That is, according to FIGS. 19A and 19B and FIG. 20, in the semiconductor device provided with the transistor having the structure described in Embodiment Modes 1 to 3, deterioration in electrical characteristics of the diode-connected transistor is found out to be suppressed and the communication distance between the semiconductor device and the reader/writer is found out to be prevented from being shortened over time.

Note that the contents described in each drawing in this embodiment can be freely combined or replaced with the contents described in another embodiment mode or embodiment.

Embodiment 2

In this embodiment, following Embodiment 1 above, an effect in the case where the semiconductor device which utilizes the semiconductor characteristics described in Embodiment Modes 1 to 3 is an IC chip for so-called RFID capable of wireless data communication with a communication device will be described. Hereinafter, a result of changing the concentration of an impurity element to be introduced to the third region of the diode-connected transistor in the semiconductor device will be shown. In this embodiment, as the diode-connected transistor in the semiconductor device, the structure illustrated in Embodiment Modes 1 to 3 will be described.

Figure 21A:
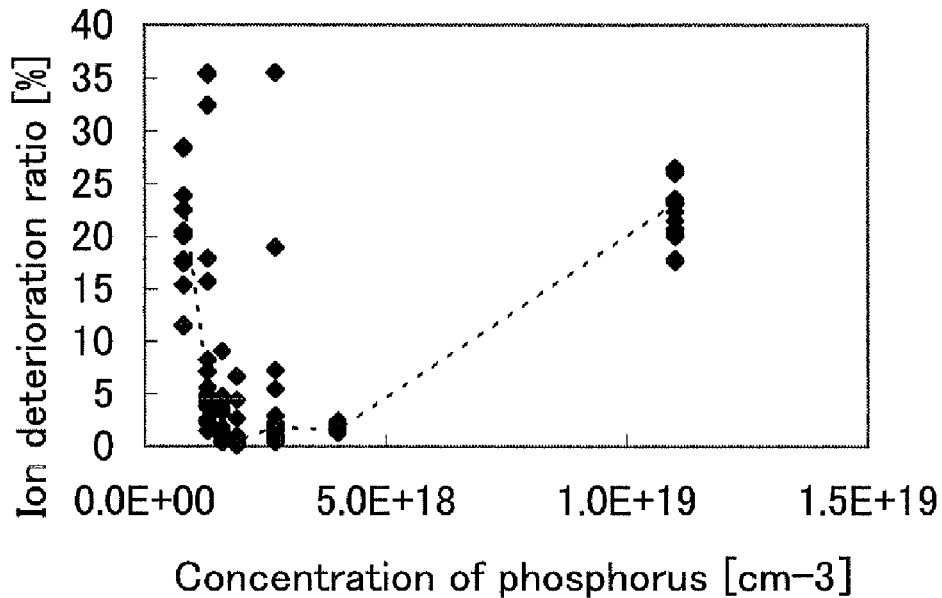
FIGS. 21A and 21B are graphs for describing Embodiment 2.

A transistor described with a graph in FIG. 21A is a transistor manufactured by the manufacturing method described in Embodiment Mode 3, in which the channel length Li is 3.0 μm, the length Lov of a third region is 0.5 μm, the channel width W is 3000 μm, and the concentration of an impurity element to be introduced to the third region is $1.9 \times 10^{18}$ cm$^{-3}$. FIG. 21A shows a relationship between the concentration of an impurity element in the third region and a decrease rate of current which flows through the transistor (hereinafter the rate is referred to as Ion deterioration ratio). Note that Ion deterioration ratio corresponds to rate of change in a value of current, which flows through the transistor described in Embodiment Mode 3, when a gate voltage of 1.0 V and a drain voltage of 10 V are applied for 100 seconds.

Figure 21B:
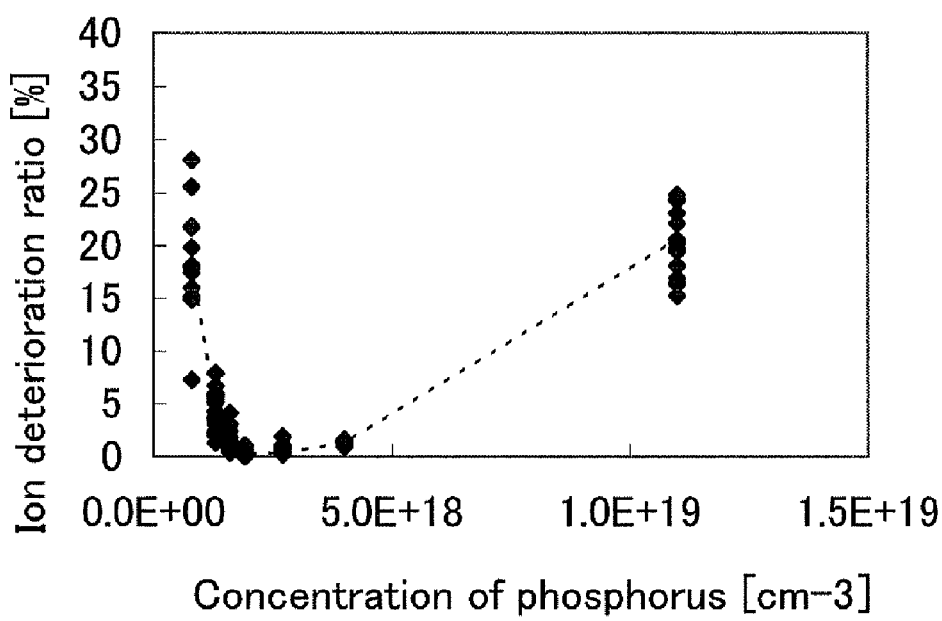

In addition, a transistor described with a graph in FIG. 21B is a transistor manufactured by the manufacturing method described in Embodiment Mode 3, in which the channel length Li is 3.0 μm, the length Lov of a third region is 1.0 μm, and the channel width W is 3000 μm. FIG. 21B shows a relationship between the concentration of an impurity element in the third region and Ion deterioration ratio.

As shown in FIGS. 21A and 21B, regardless of the value of the length Lov of the third region, Ion deterioration ratio is found to decrease and a deterioration ratio of current which flows through the transistor is found out to be suppressed when the concentration of an impurity element introduced to the third region is $1.0 \times 10^{-18}$ to $1.0 \times 10^{-19}$ cm$^{-3}$, preferably $2.0 \times 10^{-18}$ to $4.0 \times 10^{-18}$ cm$^{-3}$.

Note that the contents described in each drawing in this embodiment can be freely combined or replaced with the contents described in another embodiment mode or embodiment.

This application is based on Japanese Patent Application serial no. 2008-027140 filed with Japan Patent Office on Feb. 7, 2008, the entire contents of which are hereby incorporated by reference.

What is claimed is:

1. A semiconductor device comprising:
   a semiconductor comprising:
      a first region comprising an impurity element imparting n-type conductivity;
      a second region comprising the impurity element imparting n-type conductivity;
      a third region between the first region and the second region; and
      a channel region between the first region and the third region; and
   a gate electrode overlapped with the semiconductor with a gate insulating film interposed between the gate electrode and the semiconductor,
   wherein the first region is electrically connected to the gate electrode through a first electrode,
   wherein the second region is electrically connected to an electrode of a capacitor element through a second electrode,
   wherein the channel region overlaps with the gate electrode and is in contact with the first region, wherein the third region overlaps with the gate electrode, and wherein the third region comprises the impurity element at lower concentrations than each of the first region and the second region.

2. The semiconductor device according to claim 1, wherein the first electrode is configured to be input an AC signal.

3. The semiconductor device according to claim 2,
wherein the AC signal is a signal which consecutively inputs a first potential and a second potential with a reference potential as an intermediate potential between the first potential and the second potential, and
wherein a potential of a signal output from the second region is higher than the reference potential and equal to or lower than the first potential.

4. The semiconductor device according to claim 1, wherein the first electrode is electrically connected to an antenna for receiving a wireless signal.

5. The semiconductor device according to claim 1, wherein a concentration of the impurity element to be introduced to the third region is $2.0 \times 10^{-18}$ to $4.0 \times 10 \times 10^{-18}$ cm$^{-3}$.

6. The semiconductor device according to claim 1, wherein a transistor included in the semiconductor device is a thin film transistor.

7. The semiconductor device according to claim 1, wherein at least one of the first region and the second region functions as a drain of a thin film transistor.

8. The semiconductor device according to claim 1, wherein the gate electrode overlaps with the third region entirely.

9. The semiconductor device according to claim 1 is one selected from the group consisting of an IC label, an IC tag, and an IC card.

10. The semiconductor device according to claim 1, wherein the semiconductor is a semiconductor layer on an insulating film.

11. A semiconductor device comprising:
an antenna circuit;
a rectifier circuit operationally connected to the antenna circuit and comprising a transistor comprising:
   a semiconductor comprising:
      a first region comprising an impurity element imparting n-type conductivity;
      a second region comprising the impurity element imparting n-type conductivity;
      a third region between the first region and the second region; and
      a channel region between the first region and the third region;
   a gate electrode overlapped with the semiconductor with a gate insulating film interposed between the gate electrode and the semiconductor;
a constant voltage circuit electrically connected to the rectifier circuit; and
a logic circuit electrically connected to the constant voltage circuit,
wherein the first region is electrically connected to the gate electrode through a first electrode,
wherein the second region is electrically connected to an electrode of a capacitor element through a second electrode,
wherein the channel region overlaps with the gate electrode and is in contact with the first region, and
wherein the third region overlaps with the gate electrode, and
wherein the third region comprises the impurity element at lower concentrations than each of the first region and the second region.

12. The semiconductor device according to claim 11, wherein the first electrode is configured to be input an AC signal.

13. The semiconductor device according to claim 12,
wherein the AC signal is a signal which consecutively inputs a first potential and a second potential with a reference potential as an intermediate potential between the first potential and the second potential, and
wherein a potential of a signal output from the second region is higher than the reference potential and equal to or lower than the first potential.

14. The semiconductor device according to claim 11, wherein the first electrode is electrically connected to an antenna in the antenna circuit for receiving a wireless signal.

15. The semiconductor device according to claim 11, wherein a concentration of the impurity element to be introduced to the third region is $2.0 \times 10^{-18}$ to $4.0 \times 10^{-18}$ cm$^{-3}$.

16. The semiconductor device according to claim 11, wherein a transistor included in the semiconductor device is a thin film transistor.

17. The semiconductor device according to claim 11, wherein at least one of the first region and the second region functions as a drain of a thin film transistor.

18. The semiconductor device according to claim 11, wherein the gate electrode overlaps with the third region entirely.

19. The semiconductor device according to claim 11 is one selected from the group consisting of an IC label, an IC tag, and an IC card.

20. The semiconductor device according to claim 11, wherein the semiconductor is a semiconductor layer on an insulating film.

21. A semiconductor device comprising:
a semiconductor comprising:
   a first region comprising an impurity element imparting n-type conductivity;
   a second region comprising the impurity element imparting n-type conductivity;
   a third region comprising an impurity element imparting n-type conductivity between the first region and the second region;
   a fourth region between the first region and the third region;
   a fifth region between the second region and the third region;
   a first channel region between the first region and the fourth region; and
   a second channel region between the second region and the fifth region;
a first gate electrode overlapped with the first channel region and the fourth region with a gate insulating film interposed between the first gate electrode and the semiconductor; and
a second gate electrode overlapped with the second channel region and the fifth region with the gate insulating film interposed between the second gate electrode and the semiconductor,
wherein the first region and the second region are electrically connected to the first gate electrode and the second gate electrode through a first electrode and a second electrode, respectively,
wherein the third region is electrically connected to an electrode of a capacitor element through a third electrode,
wherein the first channel region is in contact with the first region, wherein the second channel region is in contact with the second region,
wherein the fourth region comprises the impurity element at lower concentrations than each of the first region and the second region, and
wherein the fifth region comprises the impurity element at lower concentrations than each of the first region and the second region.

22. The semiconductor device according to claim 21, wherein at least the first electrode is configured to be input an AC signal.

23. The semiconductor device according to claim 22,
wherein the AC signal is a signal which consecutively inputs a first potential and a second potential with a reference potential as an intermediate potential between the first potential and the second potential, and
wherein a potential of a signal output from the second region is higher than the reference potential and equal to or lower than the first potential.

24. The semiconductor device according to claim 21, wherein the first electrode is electrically connected to an antenna for receiving a wireless signal.

25. The semiconductor device according to claim 21, wherein a concentration of the impurity element to be introduced to the fourth region is $2.0 \times 19^{-18}$ to $4.0 \times 19^{-18}$ cm$^{-3}$.

26. The semiconductor device according to claim 21, wherein a transistor included in the semiconductor device is a thin film transistor.

27. The semiconductor device according to claim 21, wherein at least one of the first region, the second region, and the third region functions as a drain of a thin film transistor.

28. The semiconductor device according to claim 21, wherein the first gate electrode and the second gate electrode entirely overlaps with the fourth region and the fifth region, respectively.

29. The semiconductor device according to claim 21 is one selected from the group consisting of an IC label, an IC tag, and an IC card.

30. The semiconductor device according to claim 21, wherein the semiconductor is a semiconductor layer on an insulating film.

* * * * *

UNITED STATES PATENT AND TRADEMARK OFFICE
CERTIFICATE OF CORRECTION

PATENT NO.       : 7,923,733 B2
APPLICATION NO.  : 12/351881
DATED            : April 12, 2011
INVENTOR(S)      : Koichiro Kamata It is certified that error appears in the above-identified patent and that said Letters Patent is hereby corrected as shown below:

At column 17, line 47, "SOT" should be --SOI--;

At column 21, line 21, "$4.0 \times 10 \times 10^{-18}$" should be --$4.0 \times 10^{-18}$--.

Signed and Sealed this
Fifteenth Day of November, 2011

David J. Kappos
*Director of the United States Patent and Trademark Office*